United States Patent [19]
Yamazaki et al.

[11] Patent Number: 6,166,397
[45] Date of Patent: Dec. 26, 2000

[54] DISPLAY DEVICE WITH INVERTED TYPE TRANSISTORS IN THE PERIPHERAL AND PIXEL PORTIONS

[75] Inventors: Shunpei Yamazaki, Tokyo; Hongyong Zhang, Kanagawa, both of Japan

[73] Assignee: Semiconductor Energy Laboratory Co., Ltd., Kanagawa-Ken, Japan

[21] Appl. No.: 09/225,900

[22] Filed: Jan. 4, 1999

Related U.S. Application Data

[62] Division of application No. 08/845,515, Apr. 24, 1997, Pat. No. 5,895,935.

[30] Foreign Application Priority Data

Apr. 27, 1996 [JP] Japan ................................ 8-130911

[51] Int. Cl.$^7$ .................................................. H01L 29/00
[52] U.S. Cl. .................. 257/59; 257/69; 257/72; 257/347; 257/348; 257/349; 257/350; 257/351; 257/352; 257/353; 257/354; 257/355
[58] Field of Search ................... 257/59, 69, 72, 257/195, 204, 206, 338, 350, 351, 355–359, 365–377

[56] References Cited

U.S. PATENT DOCUMENTS

| | | | |
|---|---|---|---|
| 5,250,835 | 10/1993 | Izawa | 257/365 |
| 5,323,042 | 6/1994 | Matsumoto | 257/351 |
| 5,434,441 | 7/1995 | Inoue et al. | 257/351 |
| 5,712,495 | 1/1998 | Suzawa . | |
| 5,834,797 | 11/1998 | Yamanaka | 257/59 |
| 5,856,689 | 1/1999 | Suzawa . | |

FOREIGN PATENT DOCUMENTS 9-45930  2/1997  Japan .

OTHER PUBLICATIONS

Hayashi et al., Fabrication of Low–Temperature Bottom–Gate Poly–Si TFTs on Large–Area Substrate by Linear–Beam Excimer Laser Crystallization and Ion Doping Method, IEDM 95 829–832 (1995).

*Primary Examiner*—Fetsum Abraham
*Attorney, Agent, or Firm*—Fish & Richardson PC

[57] ABSTRACT

A display device having high definition and high reliability, and technology for manufacturing the same. In an active matrix type display device of integrated peripheral driving circuit type, pixel TFTs of an active matrix circuit 100 are not provided with LDD regions. Also, among circuits constituting peripheral driving circuits 101, 102, buffer circuits, of which a high withstand voltage and high-speed operation are required, are made with thin film transistors having floating island regions and base regions between source and drain regions of their active layers.

24 Claims, 13 Drawing Sheets

PERIPHERAL DRIVING CIRCUIT         ACTIVE MATRIX CIRCUIT

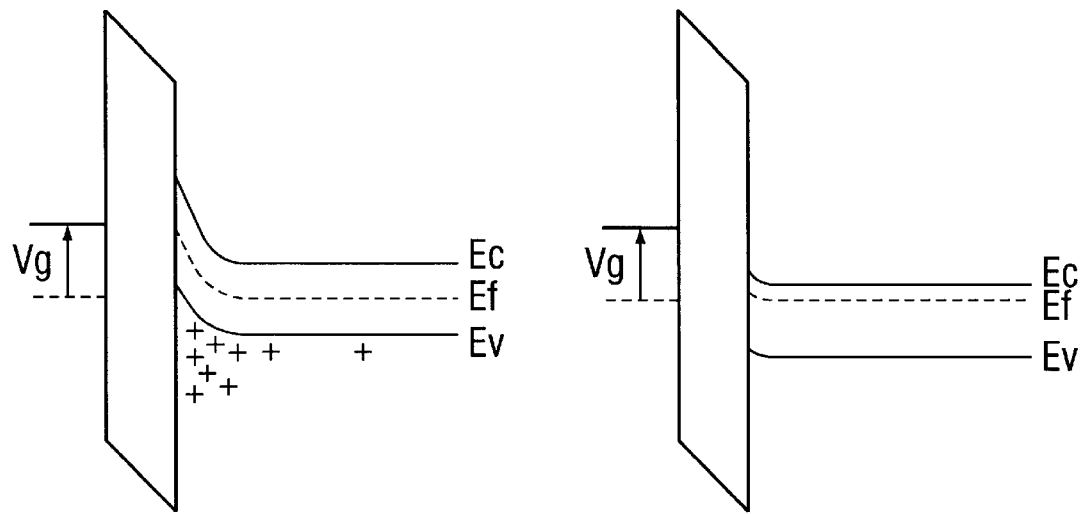
FIG. 3A            FIG. 3B
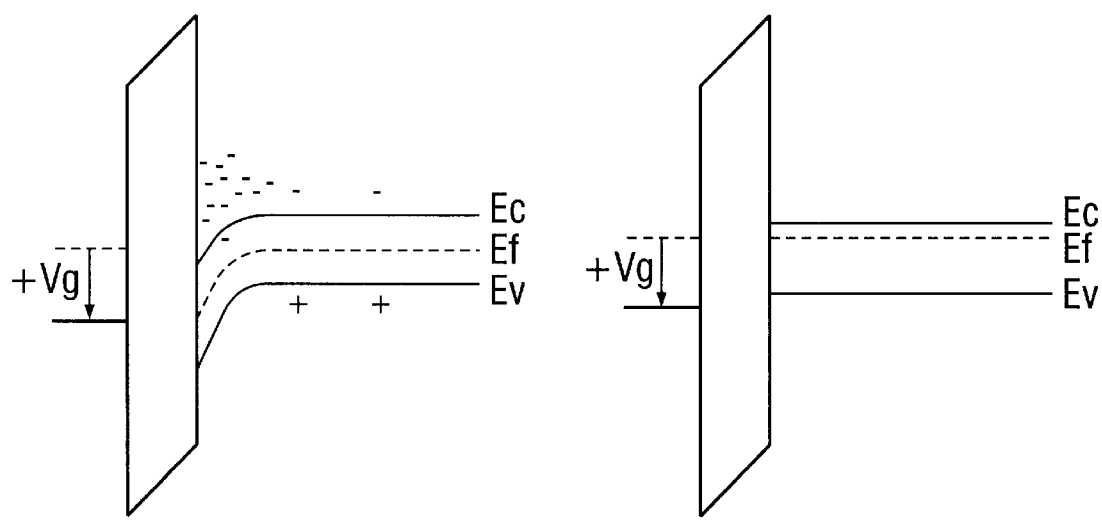
FIG. 3C            FIG. 3D

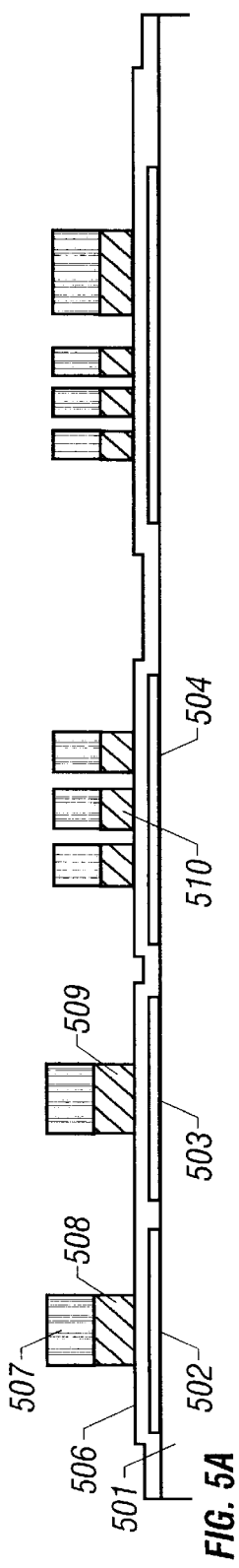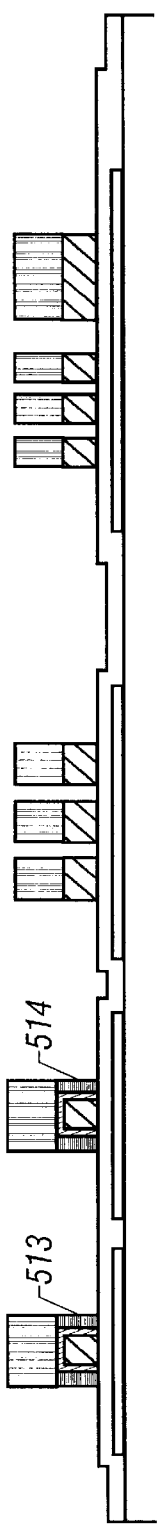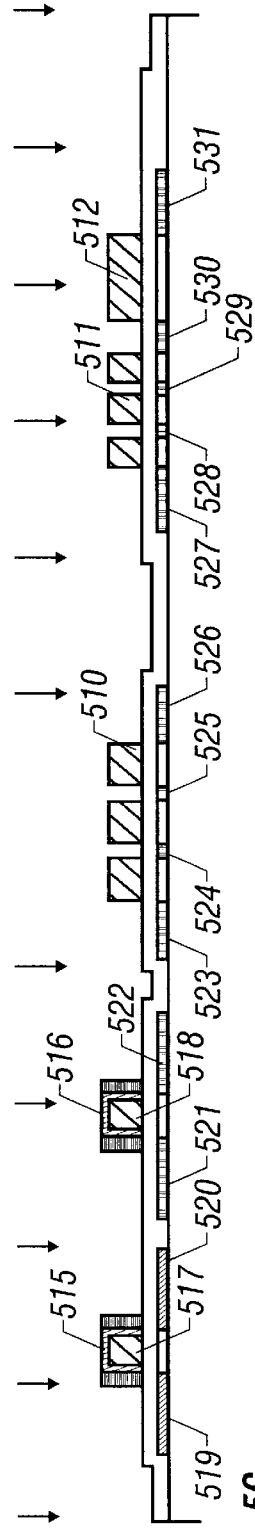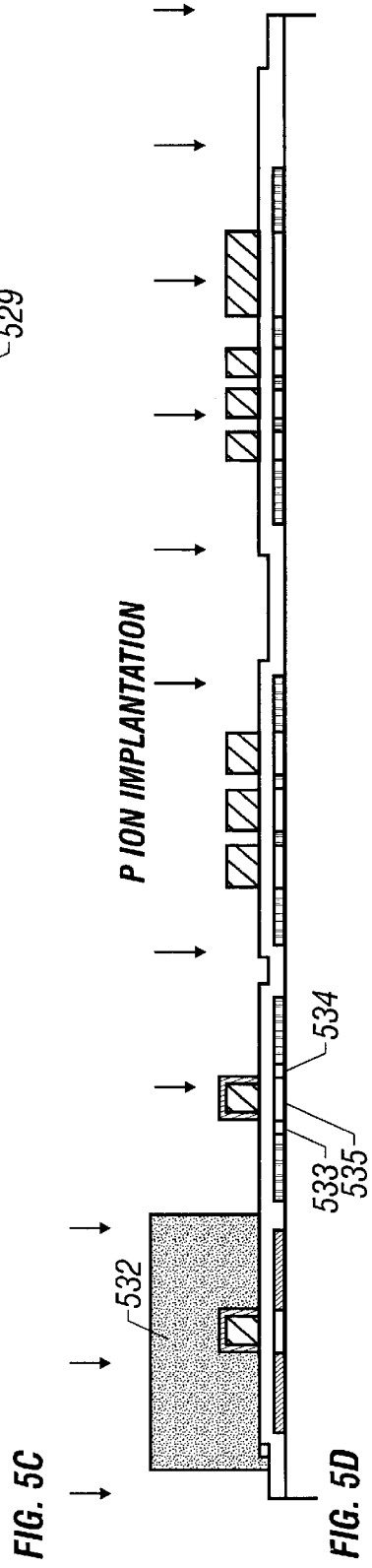

PERIPHERAL DRIVING CIRCUIT     ACTIVE MATRIX CIRCUIT

DISPLAY DEVICE WITH INVERTED TYPE TRANSISTORS IN THE PERIPHERAL AND PIXEL PORTIONS

This application is a division of U.S. Ser. No. 08/845,515 Apr. 24, 1997 U.S. Pat. No. 5,895,935.

BACKGROUND OF THE INVENTION

This invention relates to a display device comprising semiconductor devices in which crystalline thin film semiconductors are used, and a method for manufacturing the same. More particularly, the invention relates to an active matrix type liquid crystal display device.

A liquid crystal display device is an image display device having a structure wherein a liquid crystal layer is held between a pair of glass substrates and having a function of modulating visible light passing through the liquid crystal layer by applying an electric field to the liquid crystal layer and thereby causing its optical characteristics to change.

This electric field causing the optical characteristics of the liquid crystal layer to change is formed between pixel electrodes and common electrodes, and desired gradation display can be carried out by the amount of charge entering and leaving each pixel electrode being controlled according to an image signal.

To achieve this, recently the active matrix circuit type display device has become a representative of next-generation displays and has been being researched and developed vigorously.

An active matrix type display device is a device wherein a thin film transistor (TFT) is provided in each of as many as several million pixels arrayed in the form of a matrix, and charges entering and leaving pixel electrodes of the pixels are controlled by means of a switching function of the TFTs.

The pixel TFTs (these multiple pixel TFTs will be referred to collectively as an active matrix circuit) are controlled by circuit TFTs disposed in peripheral driving circuit areas formed at sides of a pixel area. The circuit TFTs constitute different types of circuit such as buffer circuits and shift register circuits according to how they are combined.

That is, an active matrix type display device is a construction wherein pixel TFTs disposed in a matrix in a pixel area and circuit TFTs disposed in peripheral driving circuit areas are all integrated on the same substrate.

However, at present in active matrix type liquid crystal display devices, unevenness occurring and stripe patterns appearing in displays is a problem. In particular, these stripe patterns are extremely harmful to the visual appearance of displayed images.

As a result of carrying out extensive research into display defects appearing as stripe patterns forming when a display device is driven, the present inventors have ascertained that a cause of these defects lies in LDD regions formed in the active layers of the pixel TFTs. Reasons for this are as follows.

In making active matrix type liquid crystal display devices, crystalline silicon films are generally used for the active layers of the thin film transistors. These crystalline silicon films are usually obtained by crystallizing amorphous silicon films.

As the crystallizing means, excimer laser annealing, which has the merit that it is possible to carry out crystallization at a low temperature, is widely used. Crystallization by laser annealing is carried out by irradiating with a laser beam formed into the shape of a line or into a rectangular shape. It is known that generally it is difficult to obtain uniform crystallinity in crystalline silicon films crystallized by laser annealing.

Also, silicon film in a molten state pushed between crystal grains instantaneously growing becomes solid in a state wherein it has risen just like a wave. When this happens, these parts can be observed as ridges in the surface of the crystalline silicon film obtained.

Thus the crystallinity and the surface condition of a crystalline silicon film obtained by laser annealing vary greatly over the face of the substrate.

When an LDD region is formed, the crystallinity of the crystalline silicon film is disordered by impurity ions being implanted into it and the film temporarily becomes non-crystalline. At this time, due to influences such as those of the above-mentioned differences in crystallinity and differences in the probability of ridges being present, dispersion in the impurity ion concentration arises.

As a result of this, when activation of the impurity ions and recrystallization of the silicon film is carried out by laser annealing, reflecting the above-mentioned dispersion in crystallinity and dispersion in the impurity ion concentration due to the presence of ridges, dispersion arises in the sheet resistance of the LDD regions.

That is, dispersion caused by laser annealing directly has a large affect on dispersion in the sheet resistance of the LDD regions. This dispersion in the sheet resistance of the LDD regions corresponds to dispersion in the on-current of the operating TFTs.

When this dispersion in on-current is large, the accumulation of charge to the pixel electrode is insufficient in some pixels and desired image display becomes impossible. The problem has also arisen that since dispersion in on-current influences the amount of charge accumulated to the pixel electrodes, the pixel electrode holding voltage level changes according to the dispersion in on-current, and it is not possible to obtain desired gradation display.

On the other hand, in circuit TFTs, of which high-speed operation and high output are required, because deterioration due to heat production and hot carriers becomes a serious problem, LDD regions have inevitably been indispensable.

Consequently, when pixel TFTs and circuit TFTs are made TFTs of the same structure, as in Japanese Laid-Open Application 1-289917, LDD regions have always been formed in the pixel TFTs also.

That is, when TFTs having the same structure are used in all the circuits (the active matrix circuit and the peripheral driving circuits), when the requirements of the peripheral driving circuits are considered importance is inevitably attached to deterioration resistance and LDD regions are therefore provided, but in turn this has resulted in dispersion in the on-current of the pixel TFTs and constituted a cause of display defects such as stripe patterns.

There has also been the problem that when LDD regions are disposed in circuit TFTs of buffer circuits, of which a high withstand voltage of about 16V is required, their operating speed falls and the circuit characteristics deteriorate.

SUMMARY OF THE INVENTION

It is therefore an object of the invention to solve the problems described above and provide an active matrix type display device of integral peripheral driving circuit type having high definition and high reliability, and technology for manufacturing the same.

To achieve the above-mentioned object and other objects, the invention provides a display device comprising an active matrix circuit and a peripheral driving circuit integrated on the same substrate wherein at least two types of thin film transistors having essentially differing structures and/or differing operating principles are disposed in the peripheral driving circuit and both types of the thin film transistors have structures essentially differing from that of a thin film transistor disposed in the active matrix circuit.

That is, in a construction wherein an active matrix circuit and a peripheral driving circuit formed on the same substrate are integrated, TFTs of the different circuits have differing structures and/or differing operating principles as necessary.

The invention also provides a display device comprising an active matrix circuit and a peripheral driving circuit integrated on the same substrate wherein at least two types of thin film transistors having essentially differing structures and/or differing operating principles are disposed in the peripheral driving circuit; of the at least two types of the thin film transistors, a thin film transistor of a buffer circuit has an active layer comprising a source region, a floating island region, a base region and a drain region; thin film transistors of another circuit constitute a CMOS structure wherein an n-channel thin film transistor and a p-channel thin film transistor are complementarily combined; an LDD region is formed in the n-channel thin film transistor; and no LDD region is formed in the p-channel thin film transistor or a thin film transistor disposed in the active matrix circuit.

A first main point of the invention lies in not providing buffer regions such as LDD regions in the pixel TFTs of the active matrix circuit. This is because, as mentioned above with reference to the related art, as a countermeasure to display defects appearing as stripe patterns, it is effective to adopt a construction wherein buffer regions such as LDD regions are not formed.

Also, in pixel TFTs, because only a small mobility is required and no large currents flow, there are no conditions severe on deterioration resistance. Also, it is possible to employ multi-gate type TFTs, which can be equivalently regarded as a plurality of TFTs connected in series, to moderate the electric fields acting on individual channel/drain junctions and thereby increase voltage-withstanding performance.

A second main point of the invention lies in that at least two types of circuit TFT having essentially differing structures and/or differing operating principles are provided in the peripheral driving circuit.

Here, a simplified circuit constitution of the substrate of an active matrix type liquid crystal display device on which the integrated circuits are formed (called the active matrix substrate) is shown in FIG. 1.

In FIG. 1, the reference numeral 100 denotes an active matrix circuit made up of multiple pixel TFTs arrayed in the form of a matrix. These pixel TFTs are formed without being provided with LDD regions, as described above.

The area enclosed by the dashed line 101 is a vertical scanning driving circuit area and the area enclosed by the dashed line 102 is a horizontal scanning driving circuit area. The vertical scanning driving circuit area 101 and the horizontal scanning driving circuit area 102 are respectively divided function by function into the following kinds of circuit.

First, the vertical scanning driving circuit area 101 is made up of a shift register circuit 103, a level-shifter circuit 104, a buffer circuit 105 and a sampling circuit 106. A counter circuit and a decoder circuit are sometimes combined and used as a substitute for the shift register circuit 103.

The level-shifter circuit 104 here is a circuit for performing drive voltage amplification. For example, because at present the shift register circuit 103 is driven at 10V, to drive the buffer circuit 105 at 16V, it is necessary to carry out voltage conversion from 10V to 16V in the level-shifter circuit 104.

The horizontal scan driving circuit area 102 is made up of a shift register 107, a level-shifter circuit 108 and a buffer circuit 109. Of course, here also a combination of a counter circuit and a decoder circuit can be substituted for the shift register 107.

Also, in recent years, research into 'system on glass', wherein all the systems are built on the same substrate, has been being advanced rapidly, and it is expected that in the near future a control circuit area 113 made up of a memory circuit 110, a CPU circuit 111, a digital/analog convertor circuit 112 and so on will be formed in addition to the circuits mentioned above.

Since low power consumption is usually required of these circuits, most of them operate with a driving voltage of 3 to 10V. With driving voltages of this level, it is not particularly necessary to require high withstand voltages of the TFTs constituting those circuits.

However, for reasons related to their function, it is necessary to drive the buffer circuits 105, 109 with a high voltage (for example 16V) which is 5V or more, or higher than the drive voltages of the circuits mentioned above. Consequently, in this case, it is necessary to constitute the buffer circuits 105, 109 with TFTs having a high withstand voltage.

However, because high-speed operation is required of the buffer circuits 105, 109 at the same time as a high withstand voltage, there is a limit on the increases in withstand voltage that can be obtained by providing buffer regions such as LDD regions and offset gate regions.

The reason for this is that when an LDD region or an offset gate region is provided the resistance between the source and the drain increases and this constitutes a structure disadvantageous to high-speed operation because it is not possible to raise on-current and mobility.

In the buffer circuits 105, 109, of which a high withstand voltage, high-speed operation and also large on-current characteristics are thus required, a TFT invented by the present inventors having an active layer made up of a source region, a floating island region, a base region and a drain region is used.

This TFT having an active layer made up of a source region, a floating island region, a base region and a drain region is a thin film transistor having characteristics described briefly below. This description will be made using FIGS. 2A through 4E.

This TFT basically has the construction of an insulating gate field-effect transistor. Also, it so operates that the route along which on-current flows during on-operation and the route along which off-current flows during off-operation are different.

That is, it has a structure wherein the route along which the carriers (if the TFT is an n-channel type, electrons) of times of on-operation move and the route along which the carriers (if the TFT is an n-channel type, holes) of times of off-operation move are made different.

By adopting this kind of construction, it is possible to realize low off-current characteristics, a high withstand voltage and high reliability. Also, the TFT can be operated at high speeds and furthermore can pass a large on-current.

A specific example of the construction of a TFT having the characteristics described above will now be described using FIGS. 2A through 4E. FIG. 2A shows an island-like semiconductor layer constituting the active layer of a thin film transistor. In a region 200 interposed between a region 201 constituting a source and a region 202 constituting a drain of this island-shaped semiconductor layer, ion implantation is selectively carried out to form regions imparted with a conductivity (these regions will be called floating island regions) 203 to 205.

The conductivity of these floating island regions 203 to 205 is the same as that of the region 201 constituting the source and the region 202 constituting the drain, and for example, when an n-channel TFT is being made, P+ ions are implanted at a dose of $1 \times 10^{12}$ to $1 \times 10^{14}$ atoms/cm$^2$ and preferably $3 \times 10^{12}$ to $3 \times 10^{13}$ atoms/cm$^2$.

At this time, the floating island regions 203 to 205 do not have to be in contact with the periphery of the island-shaped semiconductor layer as they are shown in FIG. 2A. That is, they may be in the form of islands which are inside the region 200 and away from its periphery.

The base region 206 into which ion implantation was not carried out inside the region 200 is a substantially intrinsic region, and constitutes a channel-forming region (this region will be called a base region).

The electrical characteristics of a thin film transistor made using an island-shaped semiconductor layer into which this kind of ion implantation has been carried out will now be briefly explained. Except where otherwise stated, the following description is made taking an n-channel TFT as an example.

In an island-shaped semiconductor layer of the kind of construction shown in FIG. 2A, when the thin film transistor is in the off-state, at the boundaries between the base region 206 and the floating island regions 203 to 205, there is a high potential barrier (energy barrier) and there is almost no movement of carriers across the boundaries. Consequently, carriers move with only the base region 206 as a route, and a current (off-current) due to movement of carriers in the direction of the arrows is observed.

However, when the thin film transistor is in the on-state, the base region 206 inverts and the potential barrier at the boundaries between the base region 206 and the floating island regions 203 to 205 becomes extremely small. As a result, carriers move easily between the base region 206 and the floating island regions 203 to 205, and a current (on-current) due to movement of carriers along the route shown with arrows in FIG. 2B is observed.

The potential barrier changing with the on-state and the off-state of the thin film transistor in this way will be explained briefly using FIGS. 3A through 3D. In FIGS. 3A through 3D, Vg is the gate voltage (Vg>0), Ec is the conduction band, Ev is the valence band and Ef is the Fermi level.

First, when the thin film transistor is in the off-state (wherein a negative voltage is impressed on the gate), the band state in the base region 206 is as shown in FIG. 3A. That is, because holes, which are the minority carriers, collect at the semiconductor surface and electrons are dispelled, a few holes move between the source and drain. This is observed as off-current.

On the other hand, in the floating island regions 203 to 205, because they have been doped with P+ ions, the Fenni level Ef has been pushed up to near the conduction band Ec. At this time, the band state in the floating island regions 203 to 205 is as shown in FIG. 3B.

As shown in FIG. 3B, in the floating island regions 203 to 205, which consist of n-type semiconductor layer, even when a negative voltage is impressed on the gate, the energy bands only bend slightly.

Therefore, the energy difference between the energy of the valence band at the semiconductor surface in FIG. 3A and the energy of the valence band at the semiconductor surface in FIG. 3B is equivalent to a potential barrier. Consequently, holes do not move back and forth between the base region 206 and the floating island regions 203 to 205.

Next, when the thin film transistor is in the on-state (wherein a positive voltage is impressed on the gate), the band state in the base region 206 is as shown in FIG. 3C. That is, because electrons, which are the majority carriers, accumulate at the semiconductor surface, movement of electrons between the source and the drain occurs.

At this time, in the floating island regions 203 to 205, the band state is as shown in FIG. 3D. As shown in FIG. 3D, similarly to when a negative voltage is impressed on the gate as described above, in the floating island regions 203 to 205, which consist of n-type semiconductor layer, even if a positive voltage is impressed on the gate, the energy bands hardly bend at all.

However, because in FIG. 3D the Fermi level has been pushed up to the vicinity of the conduction band Ec from the beginning, numerous electrons always exist in the conduction band.

Therefore, when a positive voltage is impressed on the gate, because both the base region 206 and the floating island regions 203 to 205 have band states such that electrons can move easily, the potential barrier at the boundaries of the base region 206 and the floating island regions 203 to 205 is negligible.

As described above, in the off-state only the base region 206 constitutes a carrier movement route and in the on-state both the base region 206 and the floating island regions 203 to 205 constitute a carrier movement route. This will be summarized below using a simplified model.

FIG. 4A shows the same semiconductor layer as FIG. 2A. A gate electrode 400 is shown above the base region with a gate insulating film being interposed therebetween.

When the thin film transistor is in the on-state, that is, when a positive voltage is impressed on the gate electrode 400, on-current flows in the direction of the solid line A—A' drawn in FIG. 4A. At this time, the section on A—A' is the structure shown in FIG. 4B, and the circuit diagram is as shown in FIG. 4C. Inversion layers 402 are formed in the base region below gate electrodes 401 in FIG. 4B.

When the thin film transistor is in the off-state, that is, when a negative voltage is impressed on the gate electrode, off-current flows along the broken line B—B' in FIG. 4A. At this time, the section on B—B' is the structure shown in FIG. 4D, and the circuit diagram is as shown in FIG. 4E. That is, a long base region exists below a single long gate electrode 403 and can be regarded as forming a transistor whose channel length is effectively extremely long.

Therefore, when the thin film transistor is in the on-state, because carriers move through the shortest distance and effectively the channel length is short and the channel width is wide, the observed on-current has a large value.

On the other hand, the thin film transistor is in the off-state, carriers move through the base region only and it can be regarded that effectively the channel length is long and the channel width is narrow. That is, the construction becomes one wherein the resistance component of the channel region has effectively increased, and the observed off-current has a small value.

When the kind of construction described above is adopted, without changing the area occupied by the island-shaped semiconductor layer very much, an effect of greatly reducing off-current and increasing on-current, i.e. raising the on/off ratio, is obtained, and it is possible to form an active layer having a performance superior to that of a conventional active layer.

It is also important from the point of view of increasing withstand voltage and reliability that it is possible to adopt a construction which eliminates routes of carriers conducting via the side faces of the region 200 in FIG. 2A during off-operation.

High-density traps formed during patterning exist at the side faces of the active layer, and carrier movement routes passing through these tend to form. In particular, this movement of carriers via the side faces of the active layer is a major cause of off-current during off-operation. Also, these carrier movement routes at the side faces of the active layer are unstable and constitute a cause of decrease in the reliability of a TFT.

Therefore, making the movement route of carriers during off-operation as shown by the arrows in FIG. 2A is effective in both raising off-operation withstand voltage and providing high reliability.

Also, because a thin film transistor of the kind described above itself has a high voltage-withstanding performance and resistance to deterioration, even without providing a buffer region such as an LDD region, it is possible to obtain sufficient reliability.

Summarizing the requisites mentioned above, as means for solving the abovementioned problems, it is necessary to make a display device of the following kind of construction:

(1) No buffer regions such as LDD regions are provided in the pixel TFTs of the active matrix circuit.

(2) At least two types of circuit TFT having essentially differing structures and/or operating principles are formed in the peripheral driving circuit.

In (2), of the at least two types of circuit TFT, a circuit TFT of a buffer circuit, of which a high withstand voltage is required, is a thin film transistor of the kind described using FIGS. 2A through FIG. 4E having an active layer made up of a source region, a floating island region, a base region and a drain region.

To make a display device with the construction feature (1), technology for forming LDD regions selectively is necessary. In this connection, the present inventors propose employing the following means in forming LDD regions.

That is, another aspect of the invention provides a display device manufacturing method for manufacturing a display device having a structure wherein an active matrix circuit and a peripheral driving circuit are integrated on the same substrate, comprising the steps of: forming gate electrodes and an interconnection for anodic oxidation electrically connected to the gate electrodes; separating a part of the interconnection for anodic oxidation to selectively cut off the electrical connection between the interconnection for anodic oxidation and some of the gate electrodes; and anodically oxidizing to form a porous anodic oxide film on side faces of only the gate electrodes electrically connected to the interconnection for anodic oxidation after the separating step.

The LDD region formation technology employed by the present inventors is set forth in for example Japanese Laid-Open Application 7-169974. In this application, a technique for forming LDD regions between a channel region and source and drain regions using a porous anodic oxide film formed on gate electrode side faces as a mask is provided.

It is a characteristic of the present invention that by an interconnection for anodic oxidation for forming this porous anodic oxide film being separated and thereby selectively cut off from some gate electrodes, a porous anodic oxide film is not formed on the side faces of these gate electrodes.

That is, no LDD region is formed in a TFT wherein no porous anodic oxide film is formed on the gate electrode side faces.

The invention also provides a display device manufacturing method for manufacturing a display device having a structure wherein an active matrix circuit and a peripheral driving circuit are integrated on the same substrate, comprising the steps of: forming gate electrodes and an interconnection for anodic oxidation electrically connected to the gate electrodes; anodically oxidizing the gate electrodes to form porous anodic oxide films on side faces of the gate electrodes; and selectively removing the anodic oxide film formed on some of the gate electrodes only.

In this case, after a porous anodic oxide film is first formed on all the gate electrodes, the porous anodic oxide film formed on some of the gate electrodes only is selectively removed.

In either of the two methods described above, the thin film transistors wherein a porous anodic oxide film is not formed or is removed and therefore no LDD region is formed are the pixel TFT and the TFT described above using FIG. 2A through FIG. 4E.

In FIG. 1, the pixel TFTs formed inside the active matrix circuit 100 are constructed without LDD regions.

Also, of the circuits making up the peripheral driving circuits 101, 102, for the buffer circuits 105, 109, which require high voltage-withstanding performance and high-speed operation, TFTs of the kind described above using FIG. 2A through FIG. 4E having a higher withstand voltage and higher reliability than conventional TFTs are used.

Therefore, in the peripheral driving circuits, both ordinary thin film transistors provided with LDD regions and TFTs of the kind described above using FIG. 2A through FIG. 4E are formed. These two types of thin film transistor are different in both their structures and their operating principles.

In the active matrix circuit, ordinary thin film transistors not provided with LDD regions are formed. These thin film transistors (pixel TFTs), due either to not having LDD regions or to having a different operating principle, are different from both of the two types of TFT disposed in the peripheral driving circuit.

By adopting a construction wherein LDD regions are not disposed in the pixel TFTs, it is possible to make a display device in which image display defects appearing as stripe patterns to not occur.

Also, by constituting buffer circuits with TFTs of the kind described above using FIG. 2A through FIG. 4E, it is possible to form buffer circuits capable of high-speed operation and also having high voltage-withstanding performance.

That is, with this invention, it is possible to manufacture a high definition display device having high reliability.

BRIEF DESCRIPTION OF THE DRAWINGS

FIGS. 3A through 3D are energy band diagrams showing energy states in the active layer;

FIGS. 5A through 5D are sectional views illustrating thin film transistor manufacturing processes of the first embodiment;

DETAILED DESCRIPTION OF THE EMBODIMENTS

Figure 1:
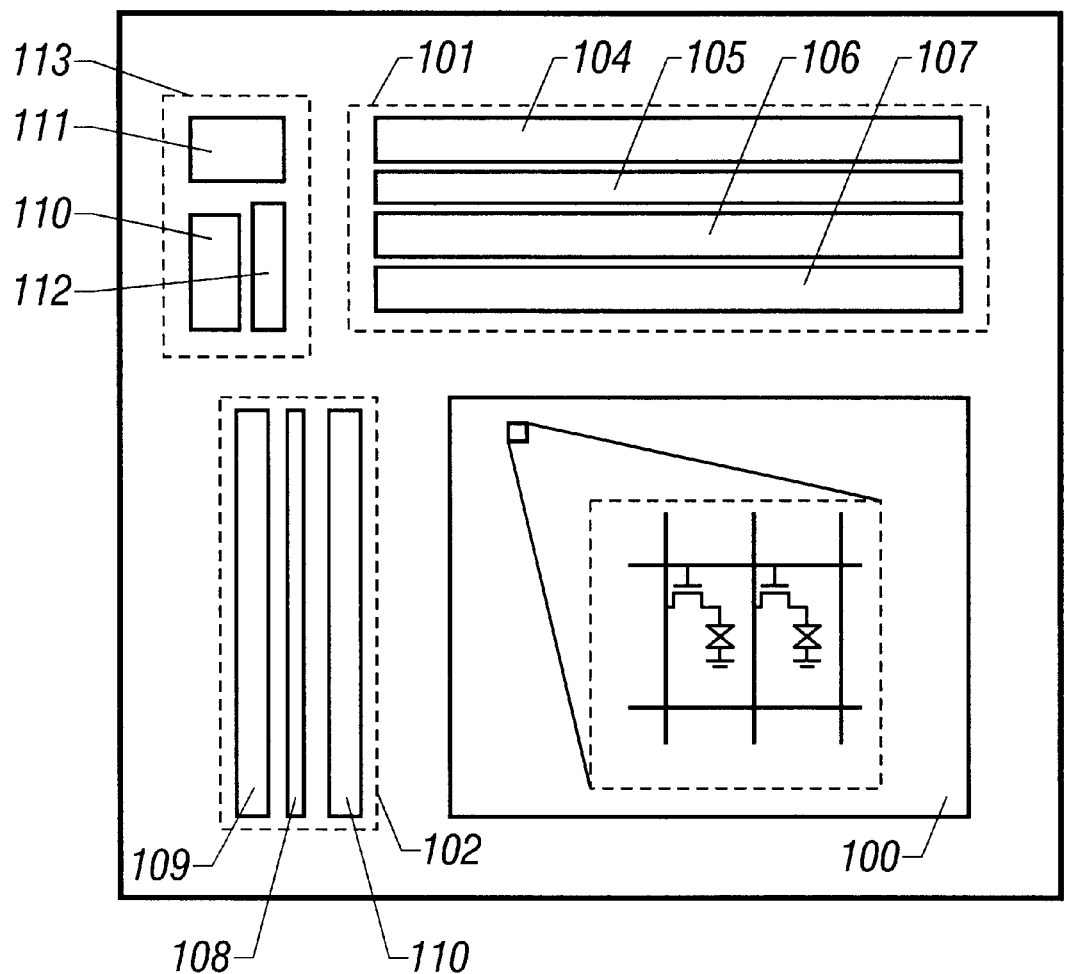
FIG. 1 is a schematic view showing the circuit constitution of an active matrix substrate.
Figure 2A:
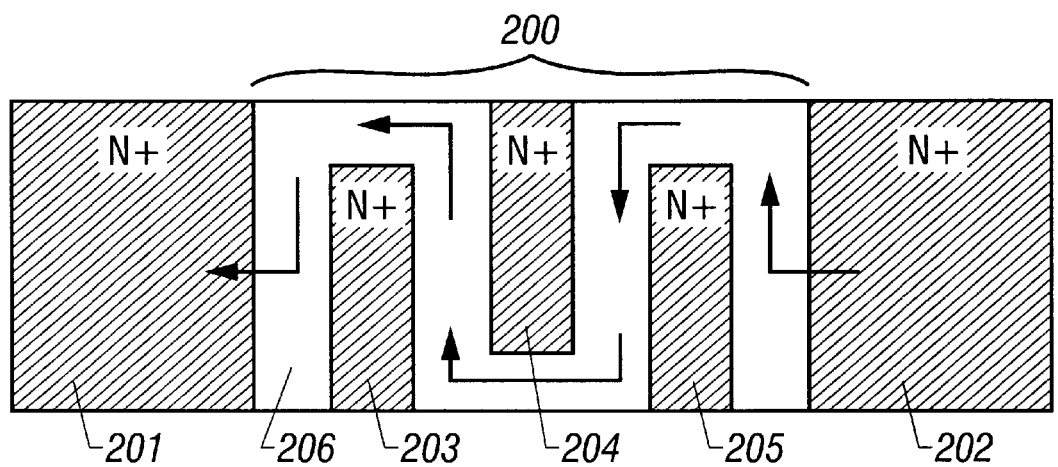
FIGS. 2A an 2B are views illustrating the constitution of an active layer.
Figure 2B:
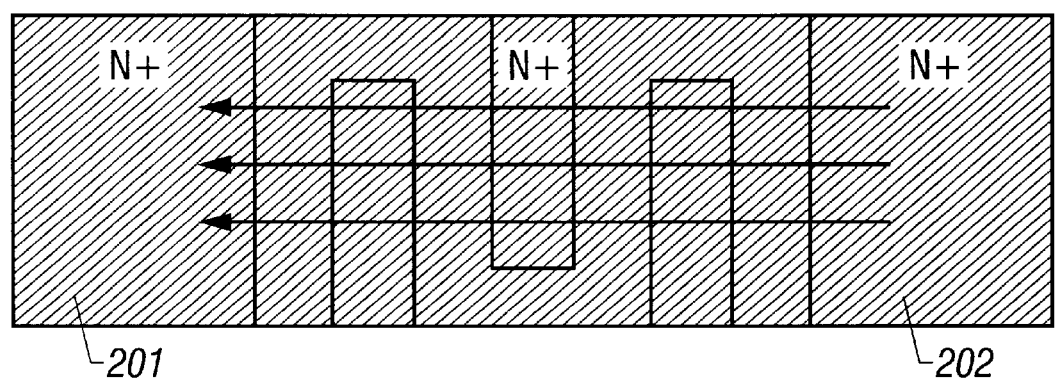

Embodiments of the invention will now be described in detail.

First Embodiment

The first embodiment shows manufacturing processes for forming on the same substrate a CMOS structure wherein an n-channel TFT and a p-channel TFT are complementarily combined, a TFT of a buffer circuit and a multi-gate TFT having a plurality of gate electrodes.

In this embodiment, an example is shown wherein a part of an interconnection for anodic oxidation is separated and electrical connection between the interconnection for anodic oxidation and some gate electrodes is thereby selectively cut off and then only gate electrodes still electrically connected to the interconnection for anodic oxidation are anodically oxidized. This will be explained with reference to FIGS. 5A to 5D.

First, as shown in FIG. 5A, a substrate 501 having an insulating surface, for example, a glass substrate having an insulating film such as a silicon oxide film thereon is prepared. Then, an amorphous silicon film (not shown) is formed on the substrate to a thickness of 200 to 1000 Å by plasma CVD or low pressure thermal CVD.

This amorphous silicon film (not shown) is crystallized by a suitable crystallizing method to obtain a crystalline silicon film (not shown). As the crystallizing method, for example, heat treatment for 1 to 24 hours at a temperature of 500 to 700° C., typically 600° C., or annealing with a light such as a KrF or XeCl excimer laser may be carried out. Further, an infrared light can be utilized to crystallize the amorphous silicon. This method using infrared irradiation is called rapid thermal anneal (RTA) or rapid thermal process (RTP). Using both of these methods together is also effective.

Also, preferably a metal element for promoting crystallization is introduced for the crystallization, so as to obtain a superior crystalline silicon film at a low temperature and in a short time.

The crystalline silicon film obtained (not shown) is then patterned to form active layers 502 to 505.

The active layer 502 forms a p-channel TFT and the active layer 503 an n-channel TFT in a CMOS structure used for a peripheral driving circuit such as a shift register circuit.

The active layer 504 forms a TFT of the kind described above using FIG. 2A through FIG. 4E and used for a buffer circuit.

The active layer 505 is for forming a multi-gate TFT used as a pixel TFT formed in an active matrix circuit.

When the active layers 502 to 505 have been formed, a gate insulating film 506 consisting of a silicon oxide film is formed covering them to a thickness of 1200 Å. As the gate insulating film 506, alternatively an insulating film such as a silicon nitride film or a silicon oxide nitride film expressed by $SiO_xN_Y$ can be used.

Next, an aluminum film (not shown) containing 0.2 wt % scandium is formed to a thickness of 2500 to 4000 Å. Scandium has an effect of suppressing the formation of needlelike projections such as hillocks and whiskers in a subsequent heat-treatment step.

Then, an extremely thin anodic oxide film (not shown) is formed on the surface of this aluminum film. Formation of this anodic oxide film is carried out using an electrolyte made by neutralizing with aqueous ammonia an ethylene glycol solution containing 3% tartaric acid. That is, anodic oxidation is carried out in this electrolyte with the aluminum film as an anode and platinum as a cathode.

The anodic oxide film formed in this step has a fine film nature and functions to raise the adherence to the aluminum film of a resist mask formed when patterning of the aluminum film is carried out. The thickness of this anodic oxide film (not shown) is made about 100 Å. This film thickness can be controlled by means of the impressed voltage.

Next, the aluminum film (not shown) is patterned using a resist mask 507 to form aluminum film patterns 508 to 511 constituting starting patterns of gate electrodes and an aluminum film pattern 512 which will be discussed later.

Figure 4A:
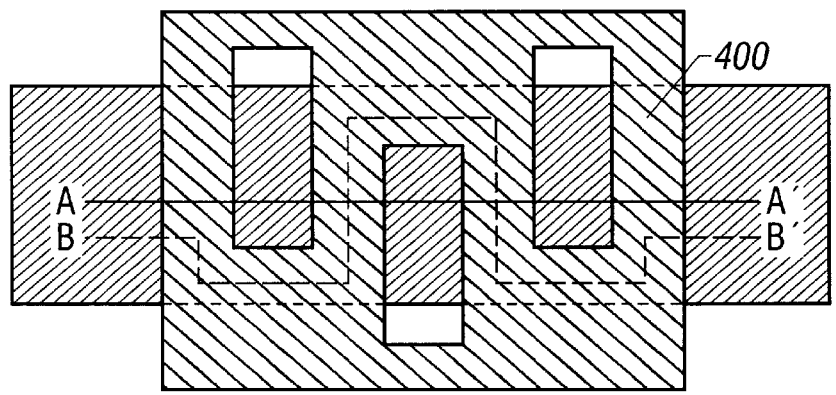
FIGS. 4A through 4E are schematic views illustrating an operating principle of the active layer.
Figure 4B:
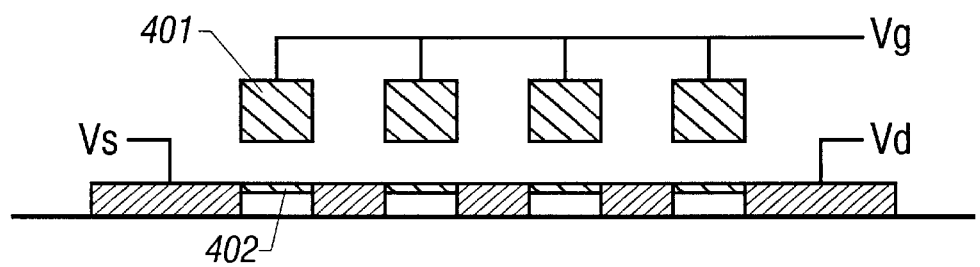
Figure 4C:
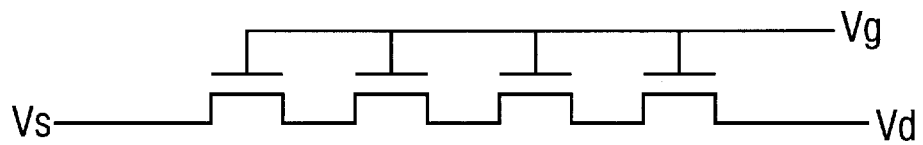
Figure 4D:
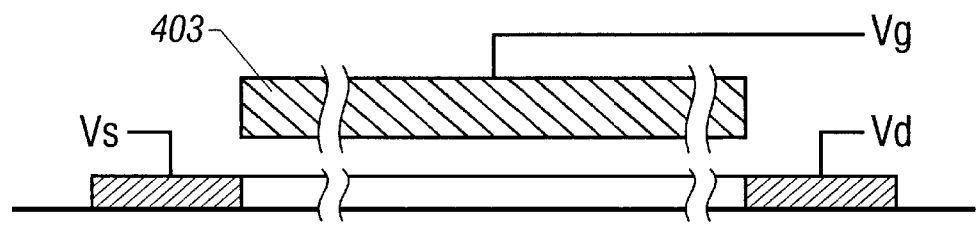
Figure 4E:
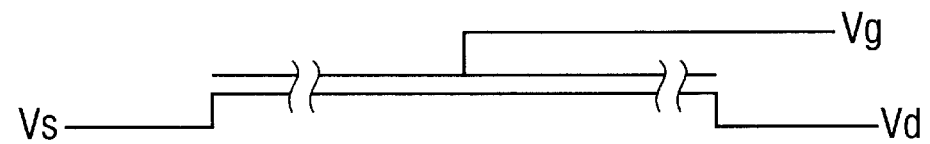

When the pattern 510 is viewed from above, like the gate electrode 400 shown in FIG. 4A it is shaped as if obtained by cutting out parts of a single gate electrode. Consequently in sectional view it looks as if it has been divided into three gate electrodes, but actually all are parts of a single electrode.

Also, the reason why in sectional view the aluminum pattern 511 appears to have been divided up, as shown in FIG. 5A, is that multi-gate TFTs are generally of a structure wherein one gate line (essentially a gate electrode) crosses an active layer that winds in a zigzag.

The sectional views of the multi-gate TFT shown in FIGS. 5A to 5D and FIGS. 6A to 6C illustrate that this TFT can be equivalently regarded as a plurality of TFTs connected in series.

The reference numeral 512 denotes a pattern constituting a basis of a capacitance line to form an auxiliary capacitance between itself and the active layer 505 across the gate insulating film 506.

Also, although not shown in the drawing, besides the aluminum patterns mentioned above, an interconnection for anodic oxidation is formed with the same material. This interconnection for anodic oxidation is electrically connected to all the gate electrodes, the gate line and the capacitance line.

Pattern formation is carried out by patterning an aluminum film (not shown) as described above, but in this invention it is important that at this time a part of the interconnection for anodic oxidation is separated simultaneously with the pattern formation.

That is, a part of the interconnection for anodic oxidation is separated and specified aluminum patterns only are thereby electrically cut off. In this embodiment, the aluminum patterns 510, 511, 512 are cut off from the interconnection for anodic oxidation (not shown).

In this way, the state shown in FIG. 5A is obtained. In the state shown in FIG. 5A, only the aluminum film patterns 508, 509 are connected to the interconnection for anodic oxidation.

Anodic oxidation is then carried out again with the aluminum film patterns 508 and 509 as anodes. Here, 3% aqueous oxalic acid solution is used as the anodic oxidation electrolyte.

In this anodic oxidation step, because the resist mask 507 is present anodic oxidation proceeds only on the side faces of the aluminum patterns 508, 509. Consequently, anodic oxide films are formed as shown with the reference numerals 513, 514 in FIG. 5B.

The anodic oxide films 513,514 formed in this step are porous and can be made to grow to a thickness of up to several $\mu$m. In this embodiment, the thickness of the porous anodic oxide films 513, 514 is made 7000 Å. The thickness of the anodic oxide films 513, 514 can be controlled by means of the anodic oxidation time.

At this time, because the aluminum patterns 510,511,512 have been cut off from the interconnection for anodic oxidation in the above-mentioned severing step, they do not undergo anodic oxidation. That is, as shown in FIG. 5B, no porous anodic oxide film is formed on them.

Next, when the porous anodic oxide films 513, 514 shown in FIG. 5B have been formed, the resist mask 507 is removed. Then, by carrying out anodic oxidation again, fine anodic oxide films 515, 516 are formed. This anodic oxidation step is carried out under the same conditions as those with which the fine anodic oxide film mentioned above was formed.

However, the thickness of the films formed is made 500 to 2000 Å. In this step, because electrolyte penetrates to the insides of the porous anodic oxide films 513, 514, fine and strong anodic oxide films 515,516 are formed as shown in FIG. 5C.

If the thickness of these anodic oxide films is made thick, at over 1500 Å, it is possible to form offset gate regions in a later impurity ion implantation step.

Also, these fine anodic oxide films 515, 516 function to suppress the formation of hillocks on the surfaces of gate electrodes 517, 518 in a later step.

The other aluminum film patterns 510 to 512, which have been cut off from the interconnection for anodic oxidation, naturally do not have anodic oxide films formed on them in this step either. Consequently, the aluminum patterns 510 and 511 later become gate electrodes as they are and the pattern 512 becomes a capacitance line.

Next, implantation of impurity ions for forming source and drain regions is carried out. First, implantation of P (phosphorus) ions is carried out to make n-channel thin film transistors.

This ion implantation is carried out by ion doping with a high dose of 0.2 to $5 \times 10^{15}$/cm$^2$ and preferably 1 to $2 \times 10^{15}$/cm$^2$. In this step, regions 519 to 531 doped with impurity to a high concentration are formed.

The regions 519 and 520 are to be regions called contact pads, and the regions 521 and 522 are respectively the drain region and the source region of the n-channel TFT of the CMOS structure.

The regions 523 and 526 are respectively the source region and the drain region of the TFT of the kind described above using FIG. 2A through FIG. 4E, and the regions 524 and 525 are floating island regions of the same TFT.

The regions 527 and 531 are respectively the source region and the drain region of the multi-gate TFT, and the regions 528, 529 and 530 constitute conductive regions performing the role of interconnections connecting together channels of the active layer of this TFT.

In this way, the state shown in FIG. 5C is obtained. Next, the porous anodic oxide films 513, 514 are selectively removed using a mixed acid made by mixing acetic acid, phosphoric acid and nitric acid and then a resist mask 532 is formed on the element constituting the p-channel TFT and ion implantation of P ions is carried out again.

This ion implantation is carried out using a lower dose than when forming the source and drain regions previously. In this embodiment, ion doping is carried out using a low dose of 0.1 to $5 \times 10^{14}$/cm$^2$ and preferably 0.3 to $1 \times 10^{14}$/cm$^2$.

When this is done, low-concentration impurity regions 533, 534 whose impurity concentration is lower compared to that of the above-mentioned high-concentration impurity regions 519 to 531 are formed in the n-channel TFT of the CMOS structure. Also, a channel region 535 is formed self-aligningly. The low-concentration impurity region 533 disposed between the channel region 535 and the drain region 521 is a region usually called an LDD region. (FIG. 5D)

Figure 6A:
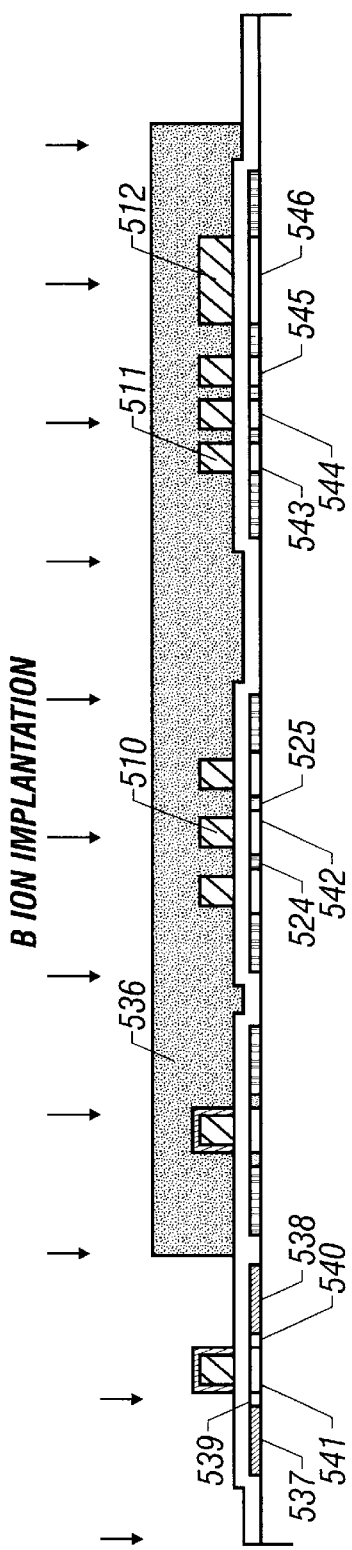
FIGS. 6A through 6C are sectional views illustrating thin film transistor manufacturing processes of the first embodiment.

Next, as shown in FIG. 6A, a resist mask 536 is formed on the elements constituting the n-channel TFTs (in this embodiment only one TFT, namely one of the TFT of the CMOS structure, is made p-type), and implantation of an impurity ion imparting p-type conductivity is carried out. At this time, because it is necessary to invert the high-concentration impurity regions 519 and 520 of FIG. 5C from n-type to p-type, ion implantation is carried out with a higher dose than in the first P ion implantation.

In this embodiment, implantation of B (boron) ions as this impurity ion imparting p-type conductivity is carried out by ion doping with a high dose of 0.1 to $2.5 \times 10^{16}$/cm$^2$ and preferably 0.5 to $1 \times 10^{16}$/cm$^2$.

As a result of this impurity ion (B ion) implantation step, p-type regions 537 and 538, more strongly p-type regions 539 and 540, and a channel region 541 are formed in the active layer of the p-channel TFT.

The present inventors define the regions 537, 538 as pads (called contact pads) essentially for providing electrical contact with subsequently formed source and drain electrodes and define the region 539 as the source region and the region 540 as the drain region.

Thus the source region 539 and the drain region 540 are formed by implanting only B ions into regions that had been substantially intrinsic. As a result, because other ions are not mixed in, control of the impurity concentration is easy and it is possible to realize PI junctions having good alignment. Furthermore, disordering of crystallinity caused by the ion implantation is also relatively small.

Therefore, with the structure of this embodiment, no LDD region is provided in the p-channel TFT. However, because the resistance to deterioration of the p-channel TFT itself is excellent, this does not constitute a problem.

It is also possible for example at the stage of the ion implantation of FIG. 5C to cover the p-channel TFT side element with a resist mask, complete the n-channel TFT according to the process described above with reference to FIG. 5D and then this time cover the n-channel TFT side elements with a resist mask and form the p-channel TFT by a similar process.

When this is done, although the number of manufacturing steps increases somewhat, it is possible to form an LDD region in both the n-channel TFT and the p-channel TFT.

Next, the region 542 is the base region of the TFT described above using FIGS. 2A through 4E, and effectively functions as a channel region. This base region 542 appears to be divided up by the floating island regions 524 and 525, but because it is self-aligningly formed below the gate electrode 510, it is all connected together like the base region 206 of FIG. 2A.

The regions denoted by the reference numerals 543 to 545 are channel regions of the multi-gate TFT and are self-aligningly formed using the gate electrode 511.

The region denoted by the reference numeral 546 is a substantially intrinsic region, but because when the TFT is actually driven a fixed voltage is constantly impressed on the capacitance line 512, it is always on the on-state, i.e. a conducting state wherein a channel is formed.

Also, after the above-mentioned impurity ion implantation steps, annealing of the regions into which ion implantation was performed is effected by carrying out irradiation with a light such as a laser light, infrared light or ultraviolet light. (The method using infrared irradiation is called RTA or RTP.) By means of this annealing, it is possible to carry out activation of the implanted impurity ions and repair of damage suffered by the active layers simultaneously.

When the state shown in FIG. 6A has been obtained in the way described above, a first interlayer insulating film 547 is formed to a thickness of 3000 Å. As the first interlayer insulating film 547, for example a silicon oxide film, a silicon nitride film or a silicon oxide nitride film can be used.

Next, contact holes are formed in the first interlayer insulating film 547 and then source electrodes 548 to 551 and drain electrodes 552 to 554 are formed. As shown by the reference numeral 552, the drain electrodes of the n-channel TFT and the p-channel TFT of the CMOS structure are connected.

Figure 6B:
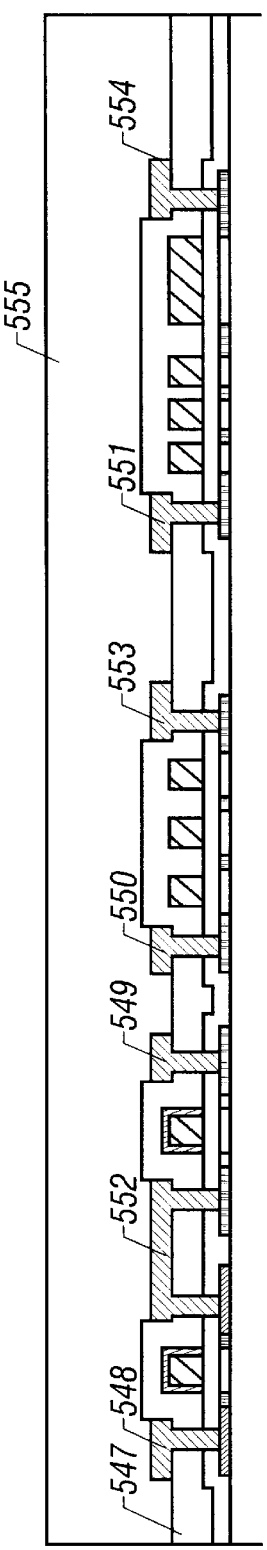

Then, a second interlayer insulating film 555 is formed to a thickness of 0.3 to 5 μm. As the second interlayer insulating film 555, a silicon oxide film, a silicon nitride film, a silicon oxide nitride film or an organic resin material or the like can be used. (FIG. 6B)

In particular, when an organic resin material such as polyamide is used, as well as it being easy to obtain film thickness, because its relative permittivity is low it is possible to reduce the formation of parasitic capacitance through the second interlayer insulating film 555 to a non-problematic level.

Also, because with an organic resin material it is possible to provide film thickness easily, not only is its effect as a flattening film great but also it has the merit that manufacturing process throughput increases.

Next, a contact hole is formed in the second interlayer insulating film 555 and a pixel electrode 556 consisting of a transparent conductive film is formed thereon. In this embodiment, an ITO (Indium Tin Oxide) film of thickness 1000 Å is used as the pixel electrode 556.

This pixel electrode 556 is so formed that it is electrically connected to the drain electrode 554 of the multi-gate TFT. Because the contact resistance between the pixel electrode (ITO film) 556 and the drain region (silicon film) 531 would be nonlinear, direct contact therebetween would tend to result in defective contact.

However, when as in this embodiment the pixel electrode 556 is electrically connected to the drain region 531 by way of the drain electrode 554, a good ohmic contact without contact problems can be obtained.

It is also an advantage that, when forming the contact hole, it is only necessary to etch the second interlayer insulating film 555. When this is done, the manufacturing process is easier than when the pixel electrode 556 is directly connected to the drain region 531, and the contact hole can be formed without its shape being destroyed.

Figure 6C:
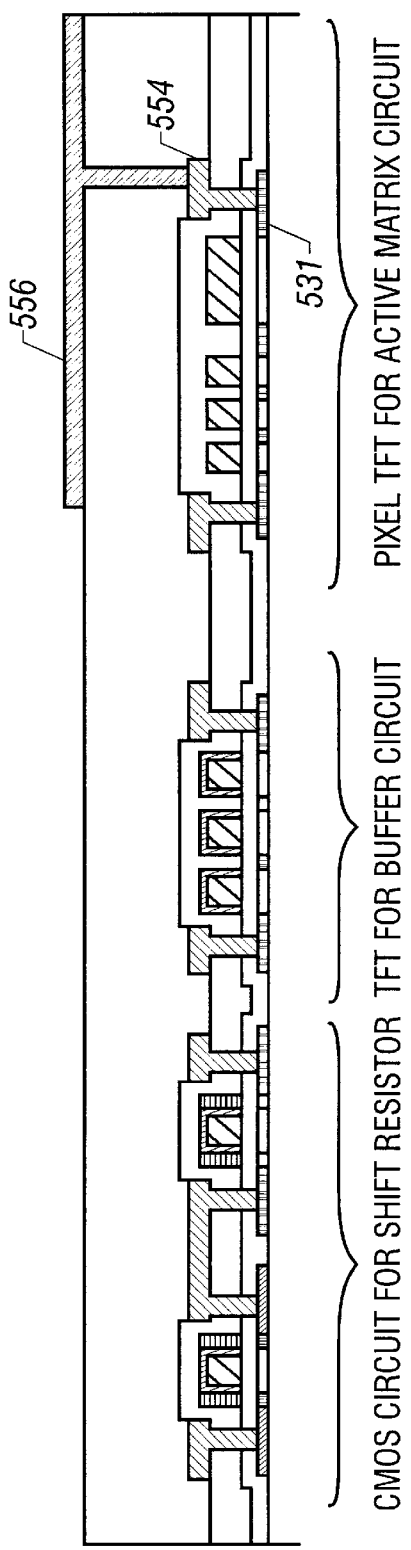

In the way described above, it is possible to form on the same substrate as shown in FIG. 6C a CMOS structure wherein an n-channel TFT and a p-channel TFT are complementarily combined, a TFT of the kind described above using FIGS. 2A through 4E for a buffer circuit and a multi-gate TFT having a plurality of gate electrodes (in this embodiment, a pixel TFT).

The CMOS structure shown in FIG. 6C is mainly used in low-voltage-driving circuits such as shift register circuits, level-shifter circuits, sampling circuits, memory circuits, CPU circuits and digital/analog converting circuits.

The TFT of the kind described above using FIGS. 2A through 4E is mainly used in high-voltage-driving circuits of which high voltage-withstanding performance is required, such as buffer circuits. In FIG. 6C only an n-channel TFT of this type is shown, but, of course, in actually making a circuit, it is also possible to make a CMOS structure by forming a p-channel TFT at the same time.

The multi-gate TFT in which no LDD region is formed is mainly used as a pixel TFT of an active matrix circuit. Not providing an LDD region constitutes a measure for preventing display defects appearing as stripe patterns, and the employment of a multi-gate TFT constitutes a measure for raising withstand voltage.

Second Embodiment

In the second embodiment is shown an example of a case wherein a method of selectively forming LDD regions different from the method used in the first embodiment is used. Specifically, it is an example of a case wherein a porous anodic oxide film is first formed on all of the aluminum film side faces and is then removed selectively.

As a basic description would be the same as that of the first embodiment, only points of difference will be described here, using FIGS. 7A through 7D.

First, the same state as that shown in FIG. 5A is obtained in the same way as in the first embodiment. At this time, in consideration of the fact that all the aluminum patterns will later become thinner by the film thickness of the porous anodic oxide films, the patterns are preferably formed slightly thicker than the design dimensions of the gate electrodes.

Figure 7A:
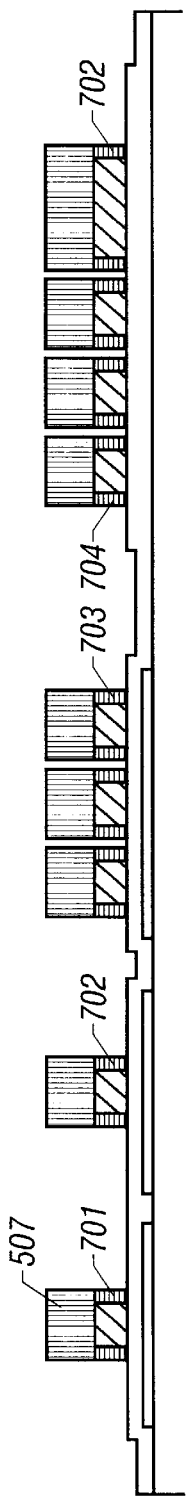
FIGS. 7A through 7D are sectional views illustrating thin film transistor manufacturing processes of the second embodiment.

Anodic oxidation is then carried out under the same conditions as those of the second anodic oxidation of the first embodiment, and porous anodic oxide films 701 to 705 are thereby formed on the side faces of all the aluminum patterns. (FIG. 7A)

Figure 7B:
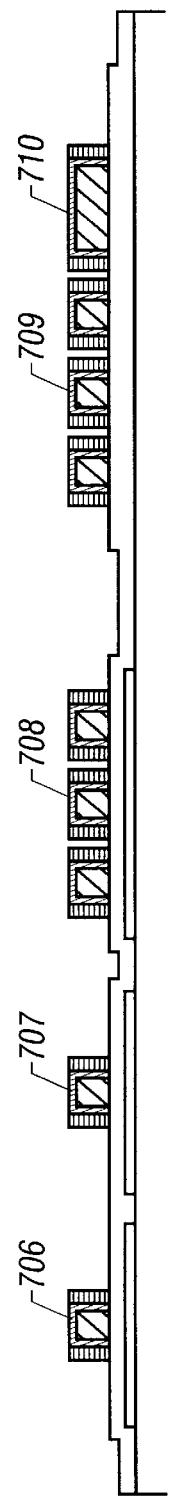

Next, the resist mask 507 disposed on the tops of the aluminum patterns is removed and then anodic oxidation is carried out again to form fine anodic oxide films. In the second embodiment, because unlike in the first embodiment separating of the interconnection for anodic oxidation has not been carried out, fine anodic oxide films 706 to 710 are formed on all the aluminum patterns. (FIG. 7B)

Figure 7C:
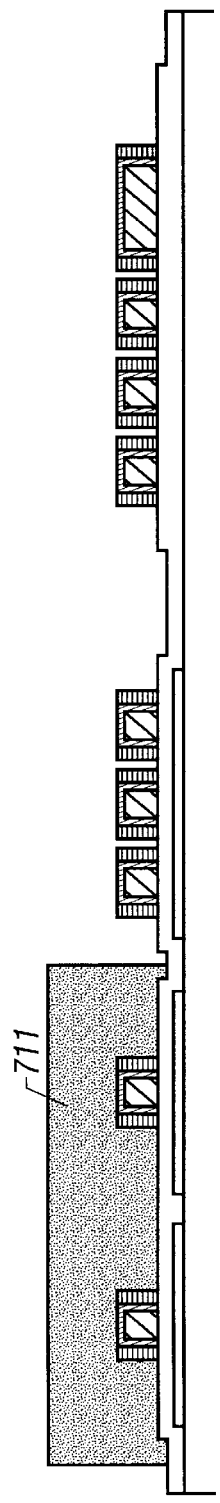

A resist mask 711 is then formed covering the n-channel TFT and the p-channel TFT of the CMOS structure. (FIG. 7C)

Removal of the porous anodic oxide films 703 to 705 is then carried out using a mixed acid made by mixing acetic acid, phosphoric acid and nitric acid.

Figure 7D:
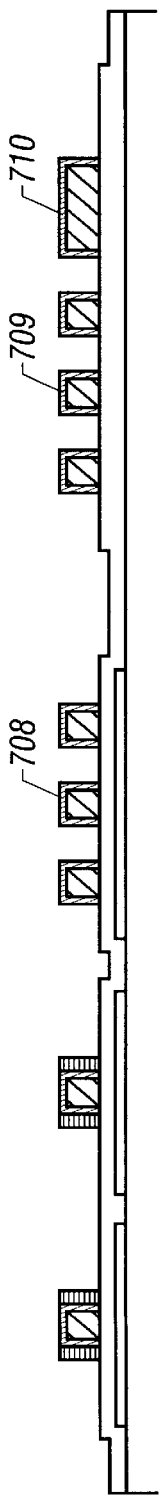

The structure shown in FIG. 7D is obtained by the process described above. This structure is basically the same as the structure shown in FIG. 5C (only the point that the fine anodic oxide films 708 to 710 are formed is different).

Therefore, if the first embodiment is followed for the remaining steps a state basically like that shown in FIG. 6C is obtained. However, in this embodiment, the point that fine anodic oxide films 706 to 710 are formed on all of the gate electrodes, the gate line and the capacitance line is different from the first embodiment.

That is, with the second embodiment, it is possible to effectively suppress hillocks and whiskers formed on the gate electrodes and the gate interconnection and so on, and shorting between interconnections caused by such projections can be prevented.

Third Embodiment

In the first embodiment an example was shown wherein the active matrix circuit, i.e. all the pixel TFTs, were n-channel TFTs, but the pixel TFTs may alternatively be p-channel TFTs.

To make a pixel TFT a p-channel TFT, it is only necessary to not dispose the resist mask 536 on the region to become the pixel TFT in the step illustrated in FIG. 6A and to carry out implantation of B ions.

When the pixel TFT is made a p-channel TFT, because the resistance to deterioration of the pixel TFT increases, it is possible to make a highly reliable image display area.

Fourth Embodiment

In the first embodiment was shown an example wherein the TFT of the kind described above using FIGS. 2A through 4E of a buffer circuit was an n-channel TFT, but this may alternatively be a p-channel TFT. It is also possible to make this a CMOS structure by forming both an n-channel TFT and a p-channel TFT.

To make the buffer circuit TFT a p-channel TFT, it is only necessary to not dispose the resist mask 536 on the region to become the TFT of the buffer circuit in the step illustrated in FIG. 6A and to carry out implantation of B ions.

When the buffer circuit TFT is made a p-channel TFT, because in addition to its inherent high voltage-withstanding performance its resistance to deterioration also increases, it is possible to make a highly reliable image display area.

Fifth Embodiment

It has already been mentioned as a reason for not providing an LDD region in the pixel TFT of the active matrix circuit in this invention that dispersion in on-current originating in LDD regions is a cause of display defects appearing as stripe patterns.

However, even when according to this invention no LDD region is provided in the pixel TFT, if for example there is dispersion in the conductivity of the source region or the drain region, dispersion also arises in the on-current due to the influence thereof.

Therefore, dispersion in the sheet resistance of the n-type or p-type conductive layer forming the source region and the drain region must be sufficiently small for its influence not to have an adverse affect on gradation display.

According to analysis results obtained by the present inventors, if the sheet resistance of the source region and the drain region is below $1\times10^3\Omega/\square$ and preferably below $0.5\times10^3\Omega/\square$, it is possible to make a display device not having the above-mentioned problem.

When impurity ion implantation with the conditions shown in the first embodiment was carried out, the sheet resistances of both n-type and p-type source regions and drain regions were within the range 300 to 500 $\Omega/\square$.

Sixth Embodiment

In the first embodiment and the second embodiment, as shown in FIG. 6C the TFT of the kind described using FIGS. 2A through 4E did not have low-concentration impurity regions, but it is also possible for this TFT to have low-concentration impurity regions.

To selectively provide low-concentration impurity regions according to the method set forth in the first embodiment, it is only necessary not to cut off the aluminum pattern to become the gate electrode of the TFT of the kind described using FIGS. 2A through 4E when cutting off the aluminum patterns on which no porous anodic oxide film is to be formed from the interconnection for anodic oxidation.

As result, because a porous anodic oxide film is formed during the second anodic oxidation, it is possible to provide a low-concentration impurity region by carrying out an ion implantation step similar to that of the first embodiment.

Also, to selectively provide a low-concentration impurity region according to the method set forth in the second embodiment, all that is necessary is to cover the TFT of the kind described using FIGS. 2A through 4E with a resist mask 712 in the step illustrated in FIG. 7C.

Because by doing this it is possible to leave a porous anodic oxide film 703, it is possible to provide a low-concentration impurity region by carrying out an ion implantation step similar to that of the first embodiment.

Figure 8:
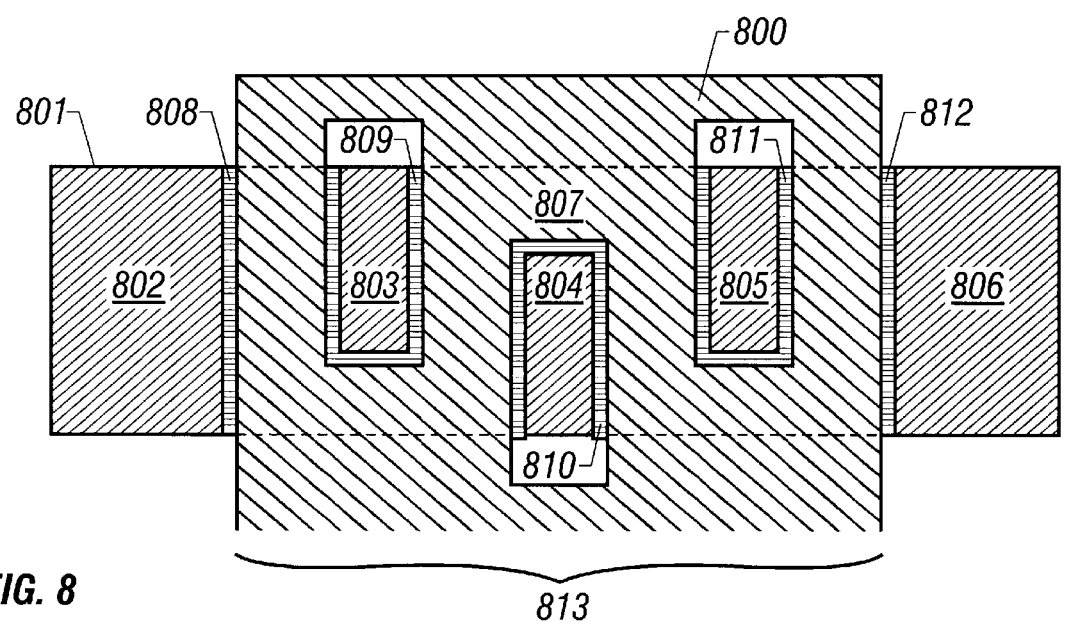
FIG. 8 is a plan view of the constitution of an active layer of the sixth embodiment.

The construction of an active layer of a case wherein a low-concentration impurity region is disposed in a TFT of the kind described using FIGS. 2A through 4E is shown in FIG. 8.

In FIG. 8, a source region 802, floating island regions 803 to 805 and a drain region 806 are formed in an active layer 801 by implanting the same concentration of impurity ions. A region shielded by a gate electrode (not shown) and into which impurity ions were not implanted forms a base region 807.

By impurity ions being implanted to a low concentration by either of the abovementioned two methods, low-concentration impurity regions 808 to 812 are formed in the periphery of the source region 802, the floating island regions 803 to 805 and the drain region 806, respectively.

During off-operation of this TFT of the kind described using FIGS. 2A through 4E, p-n junctions are formed between the floating island regions 803 to 805 and the base region (at this time showing the opposite conductive type to that of the floating island regions). When the semiconductor film is in a polycrystalline state or a microcrystalline state, deterioration and change in the junction state caused by strong electric fields tend to occur at these junctions.

At such times, the low-concentration impurity regions 808 to 812 shown in FIG. 8 are beneficial in that they can moderate strong electric fields forming at these p-n junctions.

Also, the low-concentration impurity region 812 serves as an LDD region moderating strong electric fields formed between the conductive region 813 and the drain region 806 during on-operation. Here, the conductive region 813 means the region made up of the floating island regions 803 to 805 and the inverted base region 807.

It is also possible to form an LDD region by means other than the methods mentioned above. For example, after the island-shaped semiconductor layer constituting the active layer is formed, areas other than where the LDD region is required can be covered with a resist mask or the like and impurity ions selectively implanted where the LDD region is required. However, the dose of the impurity ions should be a lower concentration than that of the source and drain regions formed later.

By forming a thin film transistor having an active layer of the kind shown in FIG. 8 according to this embodiment as described above and using this to make a buffer circuit, it is possible to make a circuit having high reliability.

Seventh Embodiment

In the first embodiment, there is a possibility of the metal element used as a catalyst to promote crystallization when crystallizing the amorphous silicon film remaining in the silicon film after the crystallization and having some undesirable affect, and this is not preferable.

Research carried out by the present inventors suggests that there is a possibility that when the metal element segregates this becomes a path for current flow and the off-current consequently increases.

In particular, to a pixel TFT, of which a low off-current is required, increase in off-current is a fatal problem which affects the charge-holding time of the pixel electrode and consequently the image display capability of the liquid crystal display device.

To avoid this, in the seventh embodiment, an example is shown of a case wherein, in employing a crystallizing method involving in introducing a metal element for promoting crystallization into the amorphous silicon film, the metal element is introduced into the peripheral driving circuit while not introduced into the active matrix circuit.

Since details of methods for forming crystalline silicon films using a metal element for promoting crystallization have been set forth in Japanese Laid-Open Application 6-232509 and Japanese Laid-Open Application 7-321339 by the present inventors, a description thereof will not be given here. According to these publications, as the metal element, the use of Ni (nickel) is preferable.

In the seventh embodiment, after films have been formed by following the same steps as in the first embodiment up to the amorphous silicon film, a silicon oxide film is deposited to a thickness of 500 to 1000 Å. This silicon oxide film functions as a mask for selectively introducing the metal element (in this embodiment, nickel will be used as an example).

When the silicon oxide film has been deposited, a window is selectively provided on only the region where the peripheral driving circuit is to be formed, and nickel introduction onto the window is carried out. The introduction of the nickel is carried out by spin coating with a nickel salt solution to form a water film containing nickel on the surface of the amorphous silicon film.

When heat treatment is then carried out at 600° C. for 4 hours, because nickel has only been introduced into the region where the window was opened, only in this region does crystallization proceed. That is, the region to become the peripheral driving circuit becomes a crystalline silicon and the region where the active matrix circuit is to be formed remains an amorphous silicon.

After that, by removing the mask consisting of a silicon oxide film and performing laser annealing with an excimer laser on the entire substrate, improvement of the crystallinity of the crystalline silicon film and crystallization of the amorphous silicon film are carried out simultaneously.

When the process described above is carried out, the peripheral driving circuit is made with a crystalline silicon film containing nickel and the active matrix circuit can be made with a crystalline silicon film not containing nickel.

When the construction shown in the seventh embodiment is adopted, no metal element such as nickel is contained in the active layer of the pixel TFT of the active matrix circuit. Therefore, because a pixel TFT having a low off-current characteristic can be formed, it is possible to manufacture a display device having a high image display capability.

Eighth Embodiment

In this embodiment an example is shown of a case wherein a silicon gate type TFT using a crystalline silicon film having a conductivity as a gate electrode is used. Because, in the case of a silicon gate type TFT, the method of forming an LDD region differs from those of the first second embodiments, this will be focused on in the following description. The description will be made using FIGS. 9A through 9D.

Figure 9A:
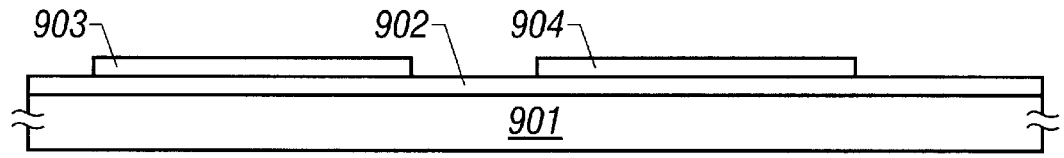
FIGS. 9A through 9D are sectional views illustrating thin film transistor manufacturing processes of the eighth embodiment.

First, a buffer layer 902 consisting of a silicon oxide film is formed on a glass substrate 901 to a thickness of 2000 Å, and an active layer 903 of a TFT of a peripheral driving circuit and an active layer 904 of a TFT of an active matrix circuit are formed thereon. (FIG. 9A)

Since means for forming the active layers 903, 904 have already been described in the first embodiment, a description here will be omitted.

Next, a gate insulating film 905 consisting of a silicon oxide film is formed to cover the active layers 903, 904 to a thickness of 1200 Å.

Then, a crystalline silicon film (not shown) having a conductivity is formed on the gate insulating film 905 and patterned to form gate electrodes 906, 907. The crystalline silicon film (not shown) having a conductivity may be formed by implanting impurity ions giving a conductivity after forming an intrinsic crystalline silicon film.

When the gate electrodes 906, 907 have been obtained in this way, implantation of impurity ions is carried out to form source regions 908, 911 and drain regions 910, 913. For example, when making an n-channel TFT, P ions can be used as the impurity ions.

Directly, beneath the gate electrodes 906, 907, impurity ions are not implanted and substantially intrinsic regions 909, 912 are formed in a self-align manner. A part of the region 909 and all the region 912 later become channel-forming regions.

Figure 9B:
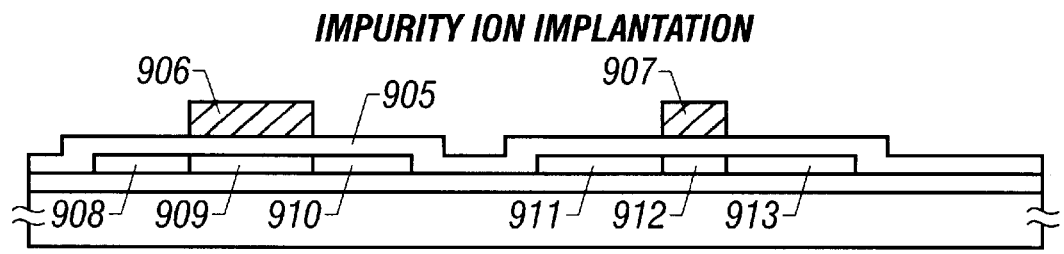
Figure 9C:
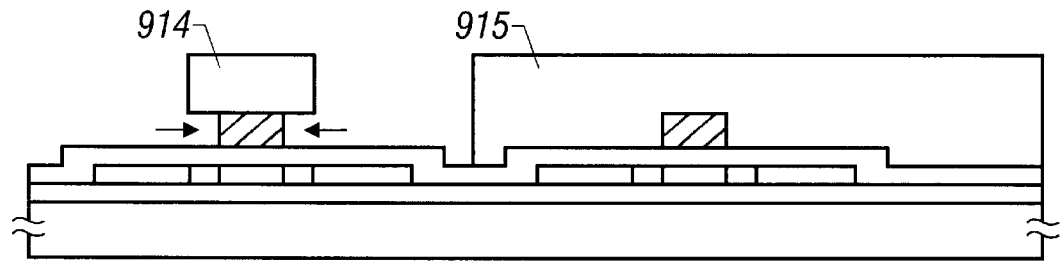
Figure 9D:
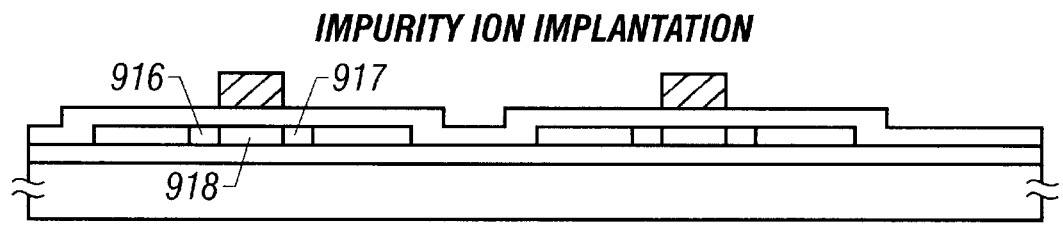

In this way, the state shown in FIG. 9B is obtained. After the state shown in FIG. 9B has been obtained, a resist mask (not shown) used in the formation of the gate electrodes 906, 907 is removed, and resist masks 914, 915 are again formed. A characteristic feature of the eighth embodiment is that the resist mask 914 is formed so as to cover only the gate electrode 906 while the resist mask 915 is formed so as to cover the whole of the active matrix circuit side element.

Then, by a dry etching method using a fluorine-based gas, isotropic etching of the gate electrode 906 is carried out. At this time, because the resist mask 914 is present on the top face of the gate electrode 906, etching proceeds in the directions shown by arrows in FIG. 9C.

Next, after etching of the gate electrode 906 has been completed, the resist masks 914, 915 are removed and implantation of impurity ions is carried out again. In this impurity ion implantation step, the same impurity ions as in the previous impurity ion implantation step are implanted in a lower dose than the previous time. (FIG. 9D) In this way, low-concentration impurity regions into which impurity ions have been implanted to a lower concentration compared to the source region 908 and the drain region 910 are formed in the regions denoted by the reference numerals 916, 917. The region 918 interposed between the low concentration impurity regions 916, 917 becomes a channel-forming region.

At this time, the low-concentration impurity region 917 disposed between the channel-forming region 918 and the drain region 910 is generally called an LDD region. The LDD region 917 has an effect of moderating strong electric fields acting at the channel/drain junction.

If the second impurity ion implantation step is not carried out, the regions 916, 917 remain substantially intrinsic and can be made offset gate regions on which the gate electrode 906 does not impress a voltage.

Even when the regions 916, 917 are made offset gate regions, the regions 916, 917 simply function as resistance components and have an effect of moderating strong electric fields acting at the channel/drain junction.

In the way described above, the state shown in FIG. 6D is obtained. The remaining steps are the same as in the first embodiment and therefore will not be described here. With the eighth embodiment, it is possible to selectively form an LDD region and the present invention can be practiced in a case wherein a silicon gate type TFT is being manufactured.

Ninth Embodiment

In the first and second embodiments, examples were shown wherein planar TFTs are formed, but the invention can also be practiced using TFTs of other types, for example inverted stagger type TFTs.

For example, even when forming a TFT of a CMOS structure of the kind shown in FIG. 6C or when forming a TFT of the kind described using FIGS. 2A through 4E, it is possible to form an inverted stagger type TFT by basically the same means.

In the ninth embodiment, examples of processes for manufacturing an inverted stagger type TFT having an ordinary structure are described respectively for the cases of an active matrix circuit and a peripheral driving circuit. The description will be made using FIGS. 10A through 10E. Details of a process for manufacturing an inverted stagger type TFT can be found in Japanese Laid-Open Application 5-275452.

Figure 10A:
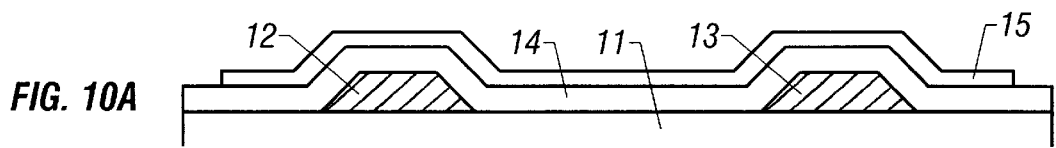
FIGS. 10A through 10E are sectional views illustrating thin film transistor manufacturing processes of the ninth embodiment.

First, in FIG. 10A, the reference numeral 11 denotes a substrate having an insulating surface (for example, a glass substrate or a quartz substrate having a buffer layer thereon). Gate electrodes 12, 13 consisting of a conductive material are formed thereon.

These gate electrodes 12, 13 are preferably made of a material having superior resistance to heat, in consideration of later crystallization of a silicon film. Here, the gate electrode 12 will be used in a TFT of a peripheral driving circuit and the gate electrode 13 will be used in a TFT of an active matrix circuit.

To raise the withstand voltages, anodic oxide films may be formed on the top surfaces and side faces of the gate electrodes 12, 13 by anodic oxidation, which is known technology.

Next, a silicon oxide film 14 functioning as a gate insulating film is formed by plasma CVD, and an amorphous silicon film (not shown) is formed thereon by plasma CVD or low pressure thermal CVD. This amorphous silicon film (not shown) is crystallized by the means shown in the first embodiment and becomes a crystalline silicon film 15 constituting an active layer. (FIG. 10A)

It is also possible to form a crystalline silicon film directly instead of crystallizing an amorphous silicon film. Low pressure thermal CVD can be used to form the crystalline silicon film directly.

Next, when the crystalline silicon film 15 has been obtained, patterning is carried out to form an active layer 16 used in a TFT of a peripheral driving circuit and an active layer 17 used in a TFT of an active matrix circuit.

The active layers 16 and 17 do not have to be formed by the method described above, and alternatively for example resist masks are disposed over the channel-forming regions (over the gate electrodes), implantation of impurity ions is carried out from above, the resist is removed, patterning is performed and then laser annealing is carried out whereby crystallization and formation of source and drain regions are executed at the same time.

It is also possible to adopt a method described above, instead of the implantation of impurity ions, with the resist masks in place an amorphous silicon film having a conductivity is deposited and formation of source and drain regions is carried out, said amorphous silicon film acting as a source of impurity ions.

Next, irradiation of the active layers 16 and 17 with UV light is carried out and a thin oxide film (not shown) is thereby formed on the surface of the active layers 16 and 17. This oxide film (not shown) functions as a protective film for preventing a subsequently formed resist mask and the active layers 16 and 17 from coming into direct contact.

Figure 10B:
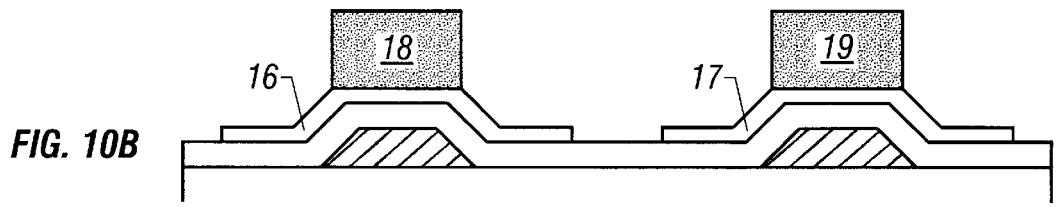

A resist mask (not shown) is then formed, and patterned using rear face exposure to leave resist masks 18, 19 on the channel-forming regions only. The resist masks 18, 19 thus formed function as masks in a later ion implantation step. (FIG. 10B)

An impurity imparting a conductivity is then implanted into the exposed active layers 16 and 17. This step may be carried out using an ordinary ion doping method.

Figure 10C:
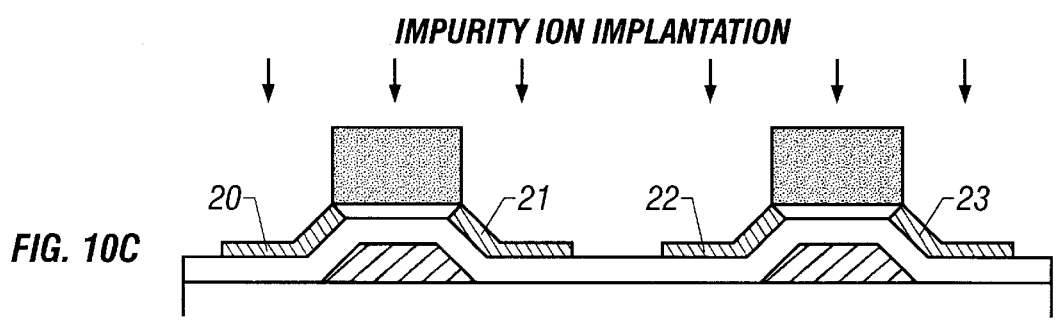

In this way, source regions 20, 22 and drain regions 21, 23 are formed in the active layers 16 and 17, respectively. (FIG. 10C)

The resist masks 18, 19 are then removed and resist masks 24, 25 are formed. At this time, it is important that the resist mask 24 should be formed thinner than the resist mask 18 formed previously. The portion by which the resist mask 24 is thus formed thinner than the resist mask 18 becomes the width of an LDD region formed later.

The resist mask 25 is so formed that it covers the entire surface of the active matrix circuit side TFT. That is, this mask is formed so that an LDD region is not formed.

With a lower dose than the previous time, implantation of impurity ions imparting the same conductivity as the previous time is then carried out to form low-concentration impurity regions 26, 27. The region into which implantation of impurity ions was not carried out due to the presence of the resist mask 24 becomes a channel-forming region 28.

The low-concentration impurity region 27 disposed between the channel-forming region 28 and the drain region 21 is generally called an LDD region.

Figure 10D:
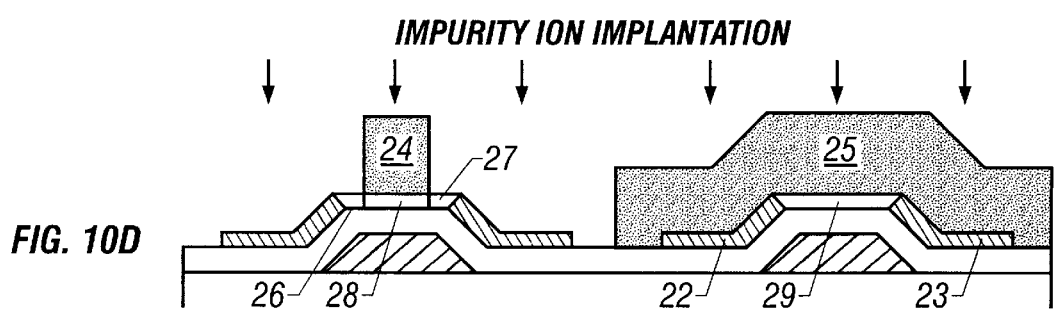

In this way, the state shown in FIG. 10D is obtained. In this state, a source region 20, a channel-forming region 28, a drain region 21 and low-concentration impurity regions 26, 27 are disposed in the TFT of the peripheral driving circuit (mainly a shift register circuit or a sampling circuit).

Also, a source region 22, a channel-forming region 29 and a drain region 23 are formed in the TFT of the active matrix circuit on the right side of the drawing.

Next, the resist masks 24, 25 are removed and then activation of the impurity ions is carried out by laser annealing or the like. This laser annealing also repairs damage suffered by the active layers during the ion implantation.

Figure 10E:
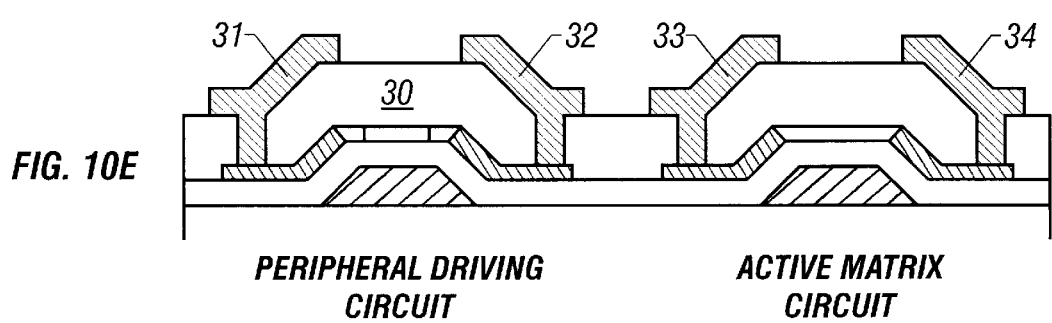

A silicon oxide film is then formed as an interlayer insulating film 30, and contact holes are formed therein. Source electrodes 31, 33 and drain electrodes 32, 34 consisting of a conductive material are then formed, and the inverted stagger type TFT shown in FIG. 10E is thereby completed.

As described above, the present invention can be fully practiced even using an inverted stagger type TFT. Because an inverted stagger type TFT has its gate electrodes 12, 13 disposed below its active layer, it has the merit than when laser annealing is used to activate impurity ions it is possible to anneal uniformly over the entire area of the active layer, without being shielded by the gate electrodes 12, 13.

There is also the merit that it is possible to make a highly reliable transistor which by virtue of its structure is resistant to contamination from the substrate 11.

Tenth Embodiment

When a CMOS structure is made by the process shown in the first embodiment, in either the n-channel TFT or the p-channel TFT an LDD region is not formed.

In the tenth embodiment, an example of a manufacturing process wherein an LDD region is formed in both the n-channel TFT and the p-channel TFT is described using FIGS. 11A through 11E. The description will refer to the CMOS structure only.

Figure 11A:
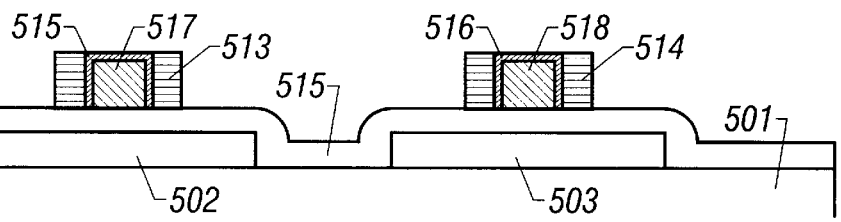
FIGS. 11A through 11E are sectional views illustrating thin film transistor manufacturing processes of the tenth embodiment.

The region constituting the CMOS structure in the state shown in FIG. 5C is shown in FIG. 11A. The reference numerals are same as in FIGS. 5A through 6C.

From the state shown in FIG. 11A, dry etching of the gate insulating film 506 is carried out with the gate electrodes 517, 518 and the porous anodic oxide films 513 and 514 as masks, and island-like gate insulating films 41, 42 are thereby formed.

Figure 11B:

The porous anodic oxide films 513, 514 are then removed using a mixed acid, and the state shown in FIG. 11B is thereby obtained.

In this state, first, implantation of P ions is carried out. As a result of this ion implantation, high-concentration impurity regions 43 to 46 into which P ions have been implanted to a high concentration are formed. Also, in the regions into which P ions were implanted through the gate insulating films 41, 42 are formed low-concentration impurity regions 47 to 50 into which P ions have been implanted to a lower concentration than the regions 43 to 46. P ions are not implanted into the regions 51, 52, and thus become substantially intrinsic regions.

Figure 11C:
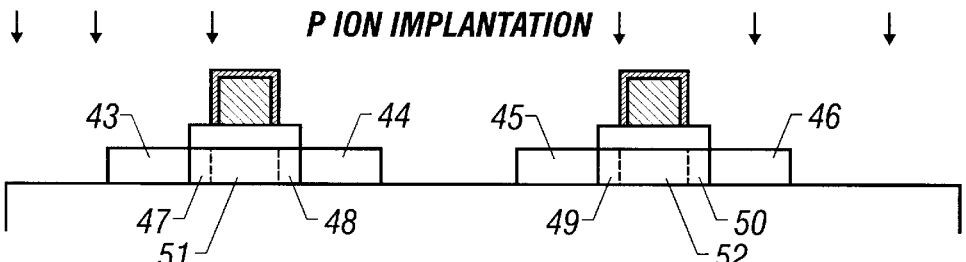
Figure 11D:
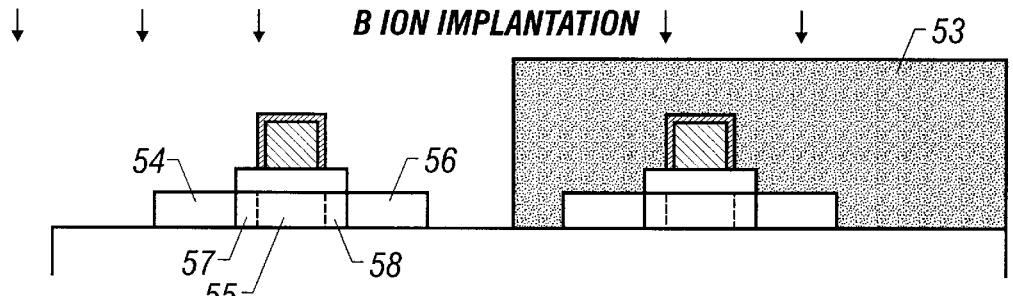

In this way, the state shown in FIG. 11C is obtained. In this state, a source region 45, a channel-forming region 52, a drain region 46 and low-concentration impurity regions 49, 50 are formed on the n-channel TFT side.

In this case, the low-concentration impurity region 50 formed between the channel-forming region 52 and the drain region 46 is called an LDD region.

Next, a resist mask 53 is formed on the n-channel TFT side and implantation of B ions given p-type conductivity is carried out. This ion implantation is carried out with a higher dose than the above-mentioned implantation of P ions.

As a result, the conductive type of the regions 43, 44, 47, 48 and 51 inverts from n-type to p-type and a source region 54, a channel-forming region 55, a drain region 56 and low-concentration impurity regions 57, 58 of a p-channel TFT are formed.

In this case, the low-concentration impurity region 58 formed between the channel-forming region 55 and the drain region 56 constitutes an LDD region.

Figure 11E:
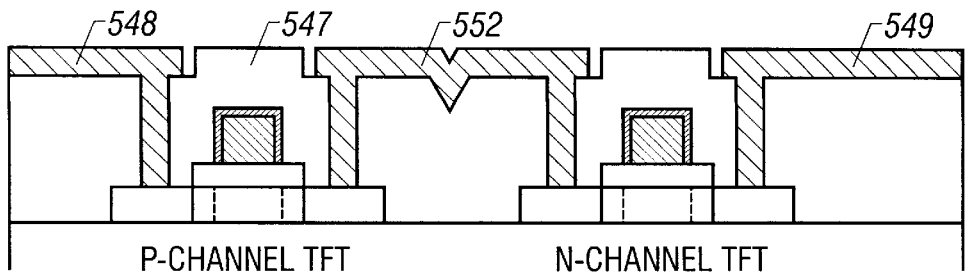

The remaining steps may be carried out according to the first embodiment, and after removing the resist mask 53, forming a first interlayer insulating film 547, source electrodes 548, 549 and a drain electrode 552, it is possible to make the CMOS structure shown in FIG. 11E.

In the tenth embodiment the order of the P ion implantation step and the B ion implantation step can be reversed without any problem.

By adopting the CMOS structure shown in the tenth embodiment, because an LDD region can be provided in the p-channel TFT also, the reliability of the circuit made using the CMOS structure can be increased.

Description of Apparatus 1

Figure 12:
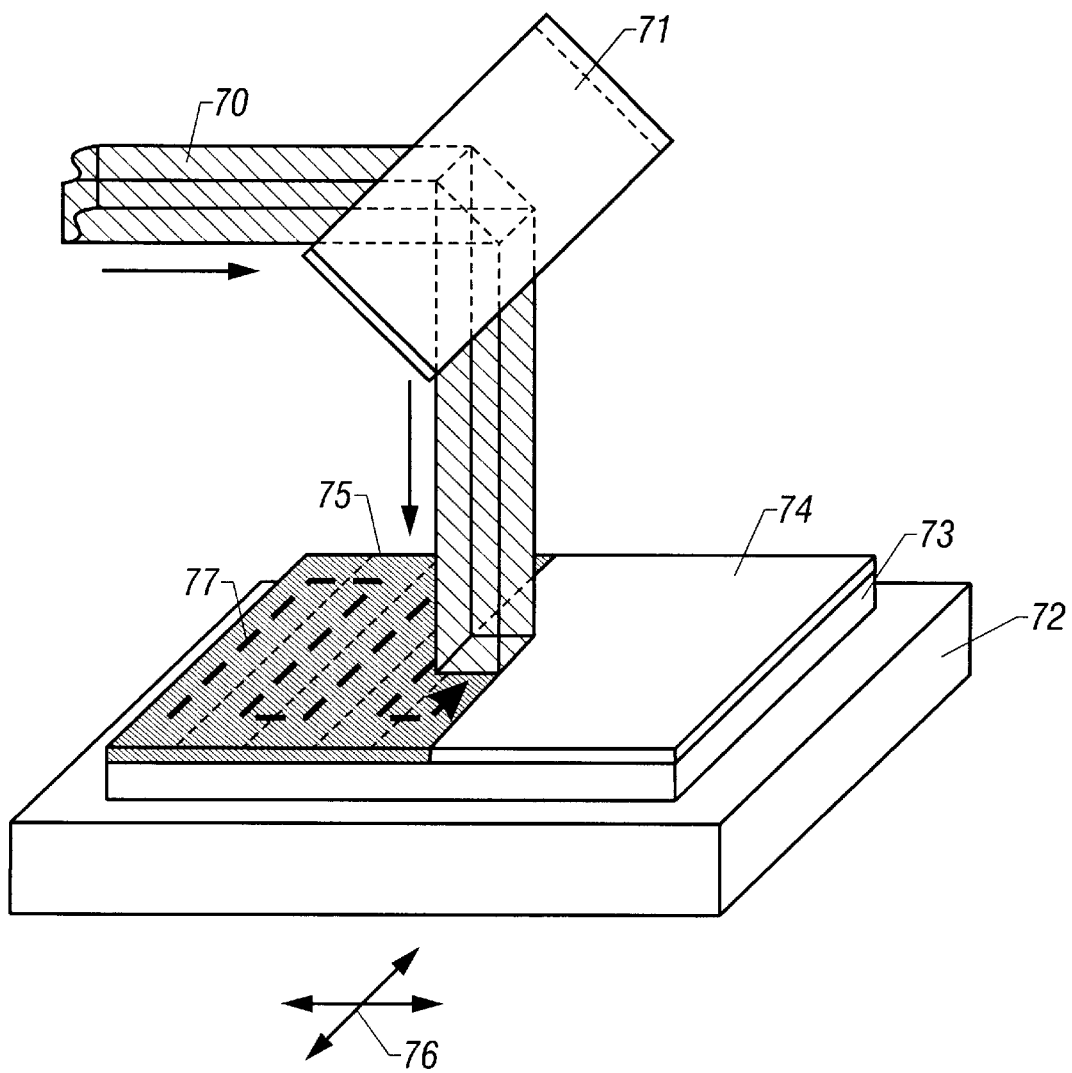
FIG. 12 is a perspective view illustrating irradiation with a laser light of the apparatus 1.

An apparatus for carrying out annealing by irradiating with a spot-shaped beam of laser light is shown in FIG. 12.

FIG. 12 schematically shows a rectangular laser beam 70 being reflected with a mirror 71 and irradiated onto an amorphous silicon film 74.

In FIG. 12, the laser beam is irradiated along a locus denoted by the reference numeral 77 and the irradiated amorphous silicon film 74 is thereby changed into a crystalline silicon film 75.

The silicon film is formed on a glass substrate 73, and the laser beam is irradiated along the locus 77 by a stage 72 being moved in a two-dimensional X-Y plane.

The kind of setup shown in FIG. 12 is not ideal for irradiating large areas but has the merit that the optical system is simple and maintenance and adjustment are easy.

Description of Apparatus 2

Figure 13:
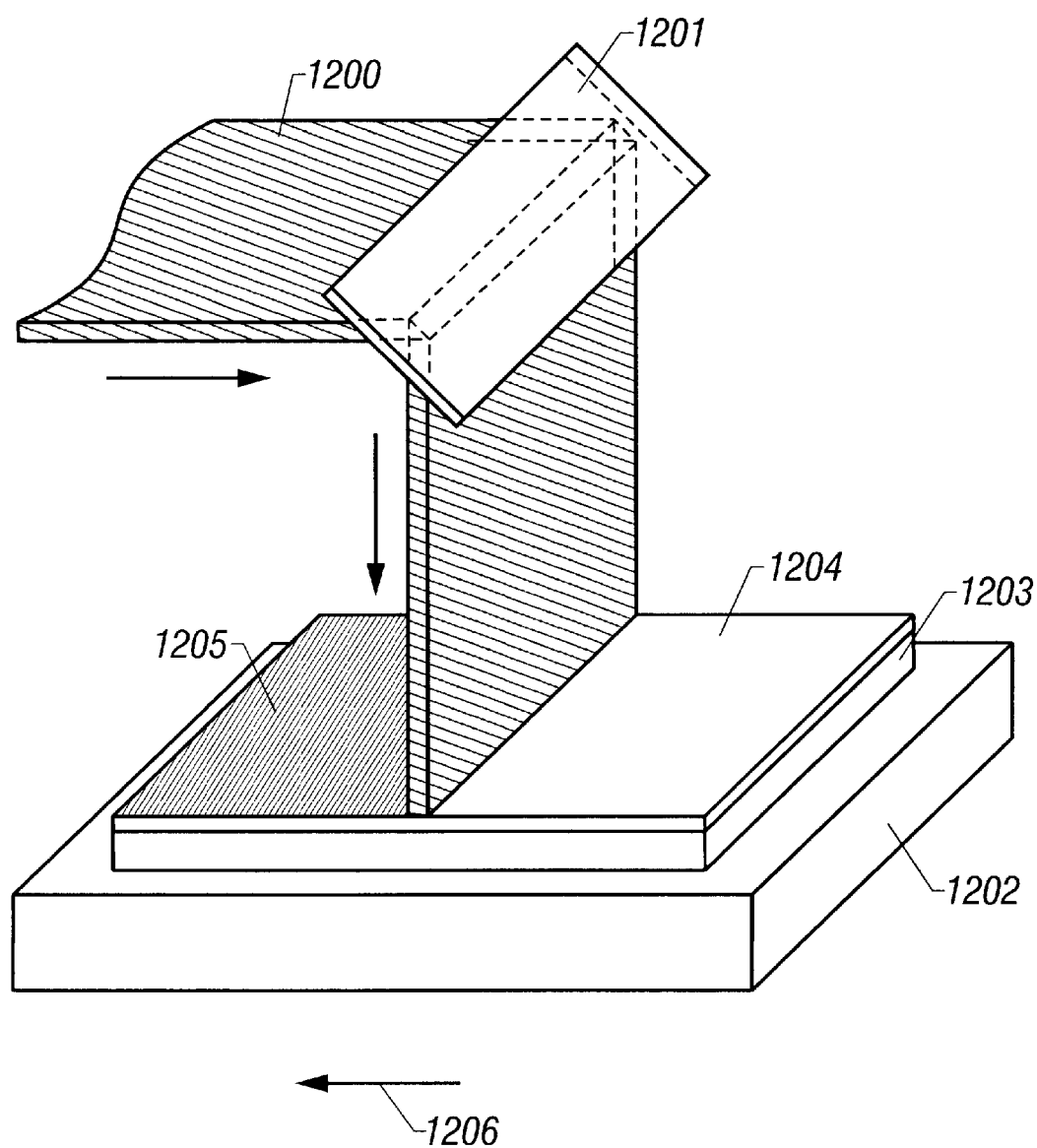
FIG. 13 is a perspective view illustrating irradiation with a laser light of the apparatus 2.

An apparatus for carrying out irradiation with a line-shaped beam of laser light will now be described briefly. FIG. 13 is a schematic view illustrating a laser beam 1200 having been shaped by an optical system into a line shape being irradiated onto an amorphous silicon film 1204 and changing it into a crystalline silicon film 1205.

In FIG. 13, the amorphous silicon film 1204 is formed on a glass substrate 1203 and a laser beam reflected by a mirror 1201 is made to scan the amorphous silicon film 1204 by a stage 1202 on which the substrate 1203 has been placed being moved in the direction of the arrow 1206.

This kind of setup has the merit that it is possible to carry out laser beam irradiation on a large area. However, there is the shortcoming that the optical system is complicated and adjustment thereof is troublesome.

As the laser beam used in this kind of apparatus, a KrF excimer laser (wavelength 248 mm) or an XeCl excimer laser (wavelength 308 mm) or the like can be used.

This annealing may be carried out for example as a step for changing an amorphous silicon film into a crystalline silicon film, a step for further promoting crystallization of a crystalline silicon film, or a step for activating impurity ions after their implantation.

With this invention, it is possible to make a low-voltage-driving circuit such as a shift register circuit, a sampling circuit or a memory circuit with circuit TFTs having LDD regions, make a buffer circuit requiring high voltage-withstanding performance with TFTs of the kind described above using FIGS. 2A through 4E, and make an active matrix circuit with pixel TFTs not having LDD regions.

By making a buffer circuit with TFTs of the kind described using FIGS. 2A through 4E, it is possible to make a highly reliable circuit capable of high-speed operation and also having a high voltage-withstanding performance.

By making an active matrix circuit with pixel TFTs not having LDD regions, it is possible to reduce dispersion in on-current thought to originate in LDD regions. Therefore, it is possible to make a liquid crystal display device without display defects such as stripe patterns.

As described above, by using this invention, it is possible to realize a high-definition liquid crystal display device having high performance and high reliability. The invention is thus an extremely industrially useful one.

What is claimed:

1. An active matrix type display device having a pixel portion and a peripheral circuit portion comprising a shift register circuit, said device comprising:
    at least an inverted stagger type thin film transistor formed in said pixel portion;
    at least a CMOS transistor formed in said peripheral circuit portion, said CMOS transistor comprising an n-type inverted stagger type thin film transistor and a p-type inverted stagger type thin film transistor;
    each of said inverted stagger type thin film transistor in said pixel portion and in said peripheral circuit portion comprising:
        a gate electrode formed on an insulating surface;
        a gate insulating film formed on the gate electrode;
        a semiconductor film formed on the gate insulating film;
        a source region and a drain region formed in the semiconductor film; and
        a channel region formed between the source region and the drain region,
    wherein one of said n-type and p-type inverted stagger type thin film transistor comprises an LDD region formed between said source region and said channel region or between said channel region and said drain region, and
    wherein said inverted stagger type thin film transistor in said pixel portion does not comprise an LDD region.

2. A circuit according to claim 1, wherein said insulating surface is a buffer layer.

3. A device according to claim 1, wherein the semiconductor film comprises crystalline silicon.

4. An active matrix type display device having a pixel portion and a peripheral circuit portion comprising a level-shifter circuit, said device comprising:
    at least an inverted stagger type thin film transistor formed in said pixel portion;
    at least a CMOS transistor formed in said peripheral circuit portion, said CMOS transistor comprising an n-type inverted stagger type thin film transistor and a p-type inverted stagger type thin film transistor;
    each of said inverted stagger type thin film transistor in said pixel portion and in said peripheral circuit portion comprising:
        a gate electrode formed on an insulating surface;
        a gate insulating film formed on the gate electrode;
        a semiconductor film formed on the gate insulating film;
        a source region and a drain region formed in the semiconductor film; and
        a channel region formed between the source region and the drain region,
    wherein one of said n-type and p-type inverted stagger type thin film transistor comprises an LDD region formed between said source region and said channel region or between said channel region and said drain region, and
    wherein said inverted stagger type thin film transistor in said pixel portion does not comprise an LDD region.

5. A circuit according to claim 4, wherein said insulating surface is a buffer layer.

6. A device according to claim 4, wherein the semiconductor film comprises crystalline silicon.

7. An active matrix type display device having a pixel portion and a peripheral circuit portion comprising a sampling circuit, said device comprising:
    at least an inverted stagger type thin film transistor formed in said pixel portion;
    at least a CMOS transistor formed in said peripheral circuit portion, said CMOS transistor comprising an n-type inverted stagger type thin film transistor and a p-type inverted stagger type thin film transistor;
    each of said inverted stagger type thin film transistor in said pixel portion and in said peripheral circuit portion comprising:
        a gate electrode formed on an insulating surface;
        a gate insulating film formed on the gate electrode;
        a semiconductor film formed on the gate insulating film;
        a source region and a drain region formed in the semiconductor film; and
        a channel region formed between the source region and the drain region,
    wherein one of said n-type and p-type inverted stagger type thin film transistor comprises an LDD region formed between said source region and said channel region or between said channel region and said drain region, and
    wherein said inverted stagger type thin film transistor in said pixel portion does not comprise an LDD region.

8. A circuit according to claim 7, wherein said insulating surface is a buffer layer.

9. A device according to claim 7, wherein the semiconductor film comprises crystalline silicon.

10. An active matrix type display device having a pixel portion and a peripheral circuit portion comprising a memory circuit, said device comprising:
    at least an inverted stagger type thin film transistor formed in said pixel portion;
    at least a CMOS transistor formed in said peripheral circuit portion, said CMOS transistor comprising an n-type inverted stagger type thin film transistor and a p-type inverted stagger type thin film transistor;
    each of said inverted stagger type thin film transistor in said pixel portion and in said peripheral circuit portion comprising:
        a gate electrode formed on an insulating surface;
        a gate insulating film formed on the gate electrode;
        a semiconductor film formed on the gate insulating film;
        a source region and a drain region formed in the semiconductor film; and
        a channel region formed between the source region and the drain region, wherein one of said n-type and p-type inverted stagger type thin film transistor comprises an LDD region formed between said source region and said channel region or between said channel region and said drain region, and wherein said inverted stagger type thin film transistor in said pixel portion does not comprise an LDD region.

11. A circuit according to claim 10, wherein said insulating surface is a buffer layer.

12. A device according to claim 10, wherein the semiconductor film comprises crystalline silicon.

13. An active matrix type display device having a pixel portion and a peripheral circuit portion comprising a CPU circuit, said device comprising:

at least an inverted stagger type thin film transistor formed in said pixel portion;

at least a CMOS transistor formed in said peripheral circuit portion, said CMOS transistor comprising an n-type inverted stagger type thin film transistor and a p-type inverted stagger type thin film transistor;

each of said inverted stagger type thin film transistor in said pixel portion and in said peripheral circuit portion comprising:

a gate electrode formed on an insulating surface;
a gate insulating film formed on the gate electrode;
a semiconductor film formed on the gate insulating film;
a source region and a drain region formed in the semiconductor film; and
a channel region formed between the source region and the drain region, wherein one of said n-type and p-type inverted stagger type thin film transistor comprises an LDD region formed between said source region and said channel region or between said channel region and said drain region, and wherein said inverted stagger type thin film transistor in said pixel portion does not comprise an LDD region.

14. A circuit according to claim 13, wherein said insulating surface is a buffer layer.

15. A device according to claim 13, wherein the semiconductor film comprises crystalline silicon.

16. An active matrix type display device having a pixel portion and a peripheral circuit portion comprising a digital/analog circuit, said device comprising:

at least an inverted stagger type thin film transistor formed in said pixel portion;

at least a CMOS transistor formed in said peripheral circuit portion, said CMOS transistor comprising an n-type inverted stagger type thin film transistor and a p-type inverted stagger type thin film transistor;

each of said inverted stagger type thin film transistor in said pixel portion and in said peripheral circuit portion comprising:

a gate electrode formed on an insulating surface;
a gate insulating film formed on the gate electrode;
a semiconductor film formed on the gate insulating film;
a source region and a drain region formed in the semiconductor film; and
a channel region formed between the source region and the drain region, wherein one of said n-type and p-type inverted stagger type thin film transistor comprises an LDD region formed between said source region and said channel region or between said channel region and said drain region, and wherein said inverted stagger type thin film transistor in said pixel portion does not comprise an LDD region.

17. A circuit according to claim 16, wherein said insulating surface is a buffer layer.

18. A device according to claim 16, wherein the semiconductor film comprises crystalline silicon.

19. An active matrix type liquid crystal display device including a peripheral circuit portion and a pixel portion comprising:

at least a first inverted stagger type thin film transistor formed in the pixel portion;

at least a CMOS transistor formed in the peripheral circuit portion;

an n-type second inverted stagger type thin film transistor and a p-type third inverted stagger type thin film transistor formed in the CMOS transistor;

said n-type second inverted stagger type thin film transistor of the CMOS transistor including:

a gate electrode formed on an insulating surface;
a gate insulating film formed on the gate electrode;
a semiconductor film formed on the gate insulating film;
a source region and a drain region formed in the semiconductor film;
a channel region formed between the source region and the drain region;
at least an LDD region formed over the gate electrode in the semiconductor film, said LDD region being formed between the source region and the channel region or between the channel region and the drain region.

20. A device according to claim 19, wherein said insulating surface is a buffer layer.

21. A device according to claim 19, wherein the semiconductor film comprises crystalline silicon.

22. An active matrix type liquid crystal display device including a peripheral circuit portion and a pixel portion comprising:

at least a first inverted stagger type thin film transistor formed in the pixel portion;

said first inverted stagger type thin film transistor comprising:

a first gate electrode formed on an insulating surface;
a first gate insulating film formed on the first gate electrode;
a first semiconductor film formed on the first gate insulating film;
a first source region and a first drain region formed in the first semiconductor film;
a first channel region formed between the first source region and the first drain region;

at least a CMOS transistor formed in the peripheral circuit portion;

an n-type second inverted stagger type thin film transistor and a p-type third inverted stagger type thin film transistor formed in the CMOS transistor;

said n-type second inverted stagger type thin film transistor comprising:

a second gate electrode formed on the insulating surface;
a second gate insulating film formed on the second gate electrode;
a second semiconductor film formed on the second gate insulating film;
a second source region and a second drain region formed in the second semiconductor film;

a second channel region formed between the second source region and the second drain region;

at least an LDD region formed over the second gate electrode in the second semiconductor film, said LDD region being formed between the second source region and the second channel region or between the second channel region and the second drain region, said p-type third inverted stagger type thin film transistor comprising:

a third gate electrode formed on the insulating surface;

a third gate insulating film formed on the third gate electrode;

a third semiconductor film formed on the third gate insulating film;

a third source region and a third drain region formed in the third semiconductor film;

a third channel region formed between the third source region and the third drain region, wherein the n-type second inverted stagger type thin film transistor includes the LDD region while neither the first inverted stagger type thin film transistor nor the p-type third inverted stagger type includes an LDD region.

23. A device according to claim 22, wherein said insulating surface is a buffer layer.

24. A device according to claim 22, wherein each of the first, second and third semiconductor films comprises crystalline silicon.

* * * * *